(12) United States Patent
Kobayashi et al.

(10) Patent No.: US 6,362,877 B1
(45) Date of Patent: *Mar. 26, 2002

(54) VISUAL INSPECTION SUPPORTING APPARATUS AND PRINTED CIRCUIT BOARD INSPECTING APPARATUS, AND METHODS OF SOLDERING INSPECTION AND CORRECTION USING THE APPARATUSES

(75) Inventors: Shigeki Kobayashi; Tamio Miyake; Koichi Tanaka; Norihito Yamamoto; Shigeru Tanimura, all of Kyoto (JP)

(73) Assignee: Omron Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/537,766

(22) PCT Filed: Apr. 21, 1994

(86) PCT No.: PCT/JP94/00657

§ 371 Date: Oct. 20, 1995

§ 102(e) Date: Oct. 20, 1995

(87) PCT Pub. No.: WO94/24518

PCT Pub. Date: Oct. 27, 1994

(30) Foreign Application Priority Data

Apr. 21, 1993 (JP) .............................. 5-119139
Jun. 14, 1993 (JP) .............................. 5-168508
Sep. 28, 1993 (JP) .............................. 5-265830

(51) Int. Cl.$^7$ .............................. G01N 21/00

(52) U.S. Cl. ..................... 356/237.5; 356/614; 382/151

(58) Field of Search ................................. 356/237, 239, 356/394, 237.1, 237.2, 237.3, 237.4, 237.5, 237.6, 239.1, 239.2, 614, 615, 622; 250/559.29, 559.3, 559.34; 382/151, 147, 145; 348/125, 126

(56) References Cited

U.S. PATENT DOCUMENTS

| 4,772,125 A | 9/1988 | Yoshimura et al. |
| 4,799,175 A | * 1/1989 | Sano et al. .................. 356/394 |
| 4,832,250 A | 5/1989 | Spigarelli et al. |
| 5,058,178 A | 10/1991 | Ray |
| 5,105,149 A | 4/1992 | Tokura |
| 5,146,509 A | 9/1992 | Hara et al. |
| 5,204,912 A | 4/1993 | Schimanski |

FOREIGN PATENT DOCUMENTS

| DE | 42 22 804 A1 | 4/1993 |
| EP | 0 383 532 A2 | 8/1990 |
| EP | 0413817 | 2/1991 |

(List continued on next page.)

Primary Examiner—Hoa Q. Pham
(74) Attorney, Agent, or Firm—Morrison & Foerster LLP

(57) ABSTRACT

An X stage (21) arranged on the front edge of a table (11) is movable in the X-axis direction along a rail (23). The X stage (21) supports a light projecting device (70) for illuminating a printed circuit board (PCB) and an imaging device (80) for imaging an inspection area illuminated by the light projecting device (70). An image obtained by the imaging device (80) is displayed on a display device (13). A Y stage (41) is movably provided along a rail (33) on a base (10). A board supporting member (50) for supporting the board (PCB) is pivotably attached to the Y stage (41) at front portion thereof. An inspector judges whether or not soldering is acceptable while seeing the image displayed on the display device (13). When it is judged that soldering is unacceptable, the inspector can correct an unacceptable soldered portion by drawing out the Y stage (41) forward and obliquely raising the board supporting member (50).

17 Claims, 39 Drawing Sheets

FOREIGN PATENT DOCUMENTS

| | | |
|---|---|---|
| EP | 0 413 817 A1 | 2/1991 |
| GB | 2 104 649 A | 3/1983 |
| JP | 55-109902 | 8/1970 |
| JP | 61-89192 | 6/1986 |
| JP | 61-251705 | 11/1986 |
| JP | 61-251705 A | 11/1986 |
| JP | 61-256207 | 11/1986 |
| JP | 62-38306 | 2/1987 |
| JP | 62-180275 | 8/1987 |
| JP | 63-120203 A | 5/1988 |
| JP | 63-120203 | 5/1988 |
| JP | 63-173488 | 7/1988 |
| JP | 2-76080 | 3/1990 |
| JP | 2-78937 | 3/1990 |
| JP | 2-231510 | 9/1990 |
| JP | 3-27475 | 2/1991 |
| JP | 4-343046 | 4/1992 |
| JP | 4-355311 | 4/1992 |
| JP | 5-332948 | 12/1993 |

* cited by examiner

Fig. 12

TEACHING TABLE

| BOARD NAME (TYPE OF BOARD) | | | |
|---|---|---|---|
| BOARD SIZE (AND ZOOM MAGNIFICATION) | | | |
| INSPECTION AREA NO. (COORDINATES) | DESIGNATION NO. (PART NAME) | DESIGNATED POINT | CODE, DIAMETER OR LENGTH & BREADTH, COORDINATES OF CENTER |
| | | | |
| | | | |

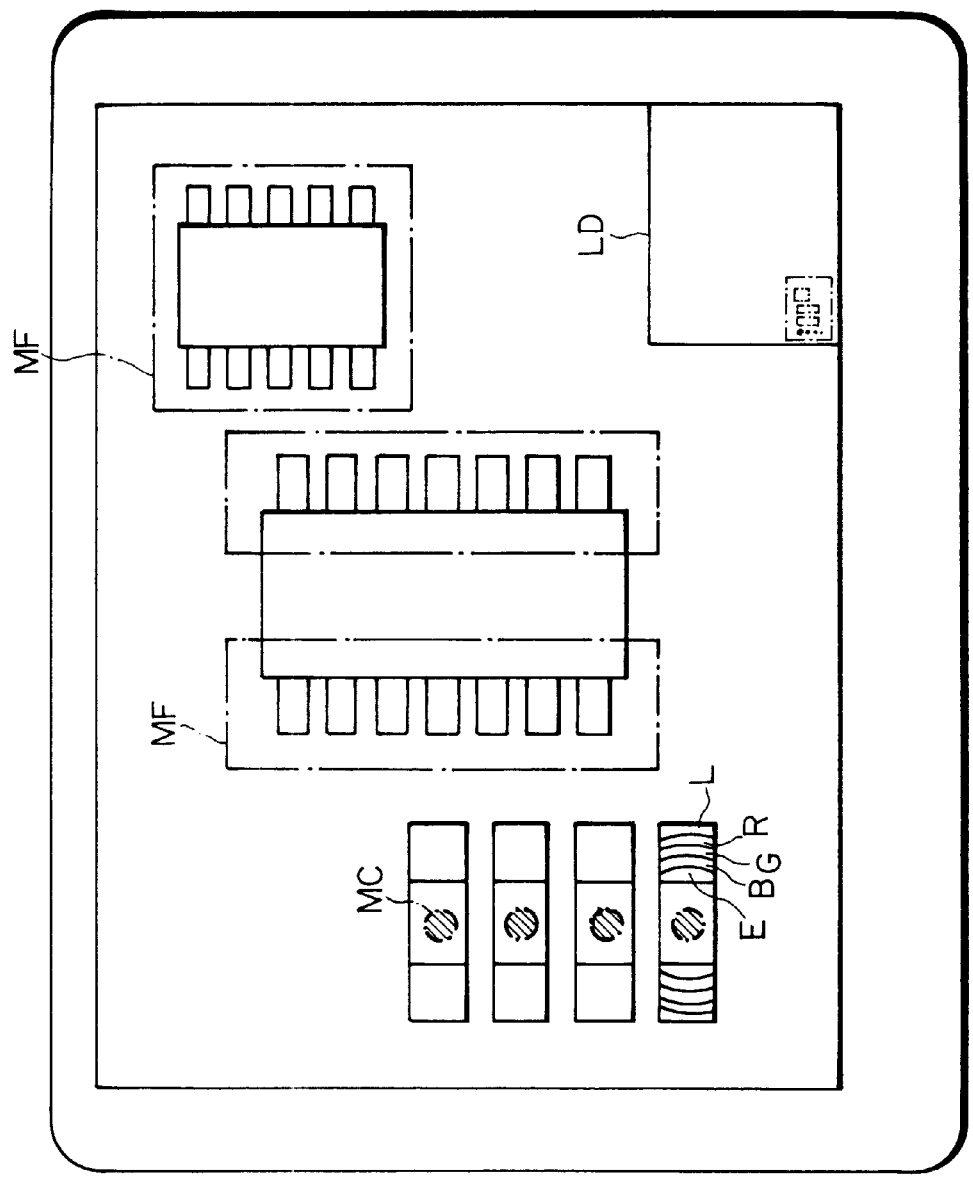

Fig.20

INSPECTION-RESULT TABLE

| BOARD NO. (AND BOARD NAME) | INSPECTION AREA NO. DESIGNATION NO. | DESIGNATED POINT | DEFECT CODE |
|---|---|---|---|
| | | | |
| | | | |

Fig. 29
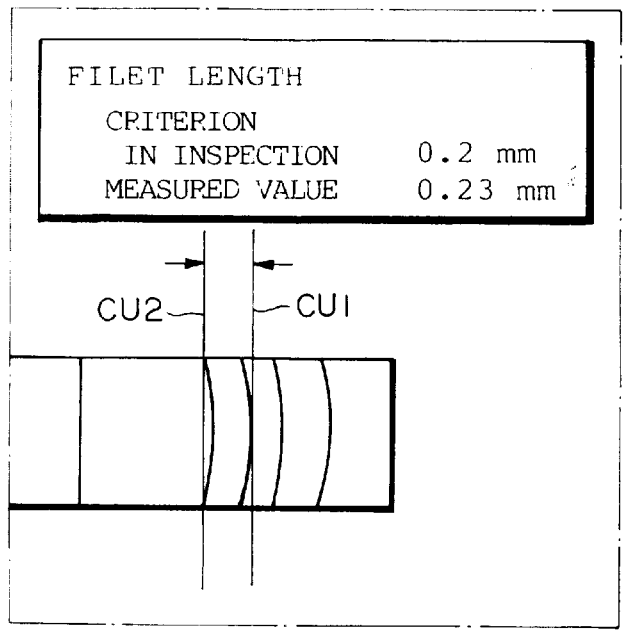
Fig. 30a
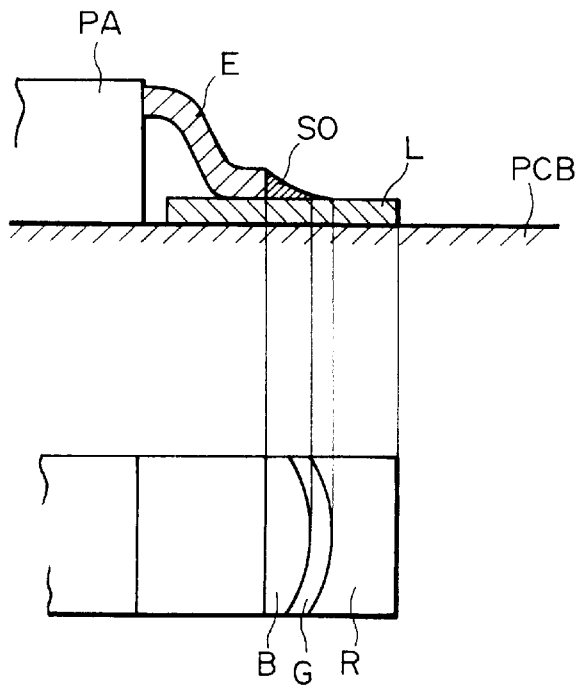
Fig. 30b

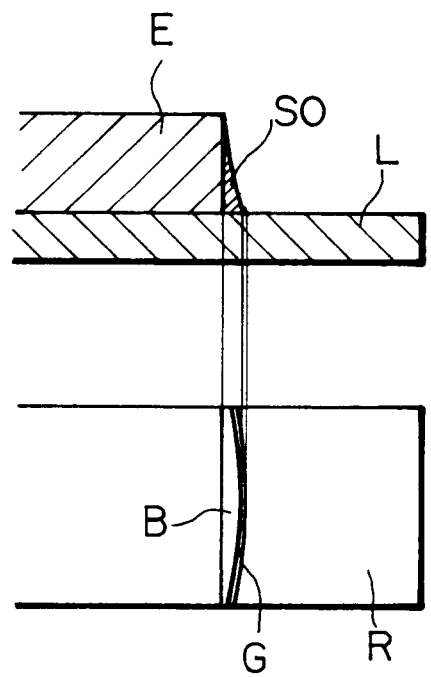
Fig. 33a
Fig. 33b
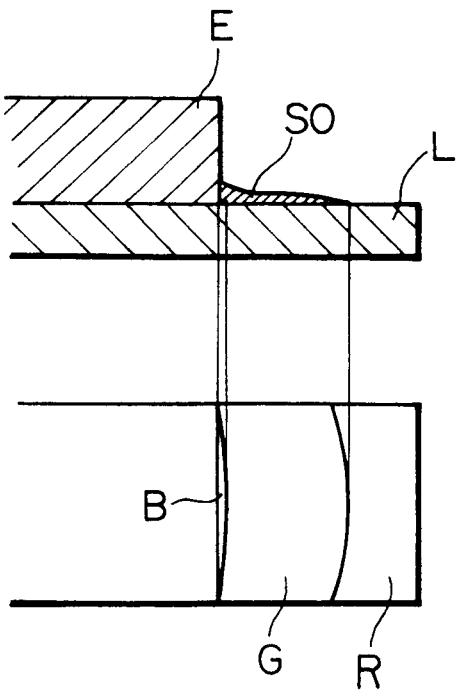
Fig. 34a
Fig. 34b

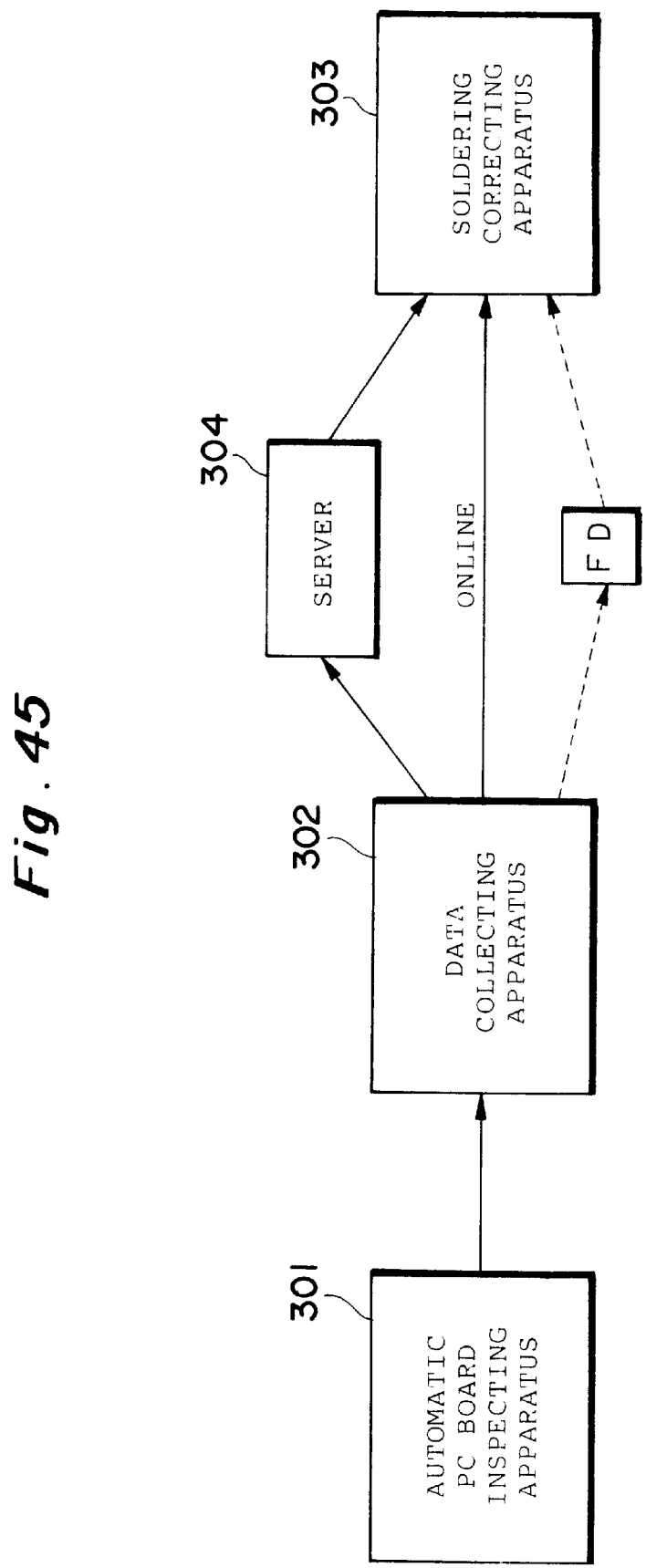

VISUAL INSPECTION SUPPORTING APPARATUS AND PRINTED CIRCUIT BOARD INSPECTING APPARATUS, AND METHODS OF SOLDERING INSPECTION AND CORRECTION USING THE APPARATUSES

TECHNICAL FIELD

The present invention relates to a visual inspection supporting apparatus which is used for an inspector to visually inspect acceptability of soldering of electronic parts mounted on a printed circuit board, and a printed circuit board inspecting apparatus, as well as a soldering inspecting method and a method of correcting an unacceptable soldered portion using the apparatuses.

BACKGROUND ART

In this type of apparatus called by various names, for example, a visual inspection supporting apparatus, a printed circuit board inspecting apparatus, an automatic printed circuit board inspecting apparatus, and an external appearance inspecting apparatus, light sources of the three primary colors, i.e., red (R), green (G) and blue (B) are generally used. The light sources are so arranged as to project illuminating light at different angles to a portion to be inspected. When the portion to be inspected is imaged by an imaging device and an image obtained by the imaging is displayed, inclined surfaces or flat surfaces having different angles are indicated in different colors. Consequently, color information can be also utilized for judging whether or not soldering is acceptable.

Various proposals have been made in such a direction as to automate judgment whether or not soldering is acceptable. Examples include a proposal for an illuminating method (see Japanese Patent Application Laid-Open Publication No. 4-355311) and a proposal for image processing or judging processing (Japanese Patent Application Laid-Open Publication No. 4-343046).

However, there are not many devices and proposals from the viewpoint of assisting an inspector in visual inspection. It is highly important to increase the operation (work) efficiency of the inspector and ensure more objective judgment which is not dependent on the personal difference between inspectors. Particularly, the visual inspection has the advantage that when an unacceptable soldered portion is found out, the unacceptable soldered portion can be immediately corrected. It has been desired to realize a suitable apparatus for supporting such visual inspection.

DISCLOSURE OF THE INVENTION

An object of the present invention is to provide a supporting apparatus for visual inspection and correction of an unacceptable portion which makes it easy for an inspector to perform work and makes it possible to improve operation (work) efficiency.

Another object of the present invention is to provide a visual inspection supporting apparatus capable of ensuring the objectivity of judgment by an inspector.

Still another object of the present invention is to provide a printed circuit board inspecting apparatus which can be developed into not only support of visual inspection but also automatic inspection.

The present invention provides a method of judging whether or not soldering on a printed circuit board is acceptable and a method of correcting a soldered portion which is judged to be unacceptable using the visual inspection supporting apparatus and the printed circuit board inspecting apparatus.

A visual inspection supporting apparatus according to the present invention comprises an illuminating device for illuminating a printed circuit board to be inspected, an imaging device for imaging an area on the board illuminated by the illuminating device and outputting an image signal representing an image obtained by the imaging, a stage which is movable relatively to the illuminating device and the imaging device in two perpendicular directions, a board supporting member supported on the stage for supporting the board to be inspected, and a mechanism for moving the stage until the board supported on the board supporting member reaches a position outside of a range in which the illuminating device and the imaging device exist.

There is generally provided a display device for displaying the image represented by the image signal outputted from the imaging device.

The visual inspection supporting apparatus is suitable for not only inspection but also correction of an unacceptable portion. Since the board supported on the stage is drawn out of the range in which the illuminating device and the imaging device exist, it is possible to correct the unacceptable portion at the position where the board is drawn out.

Preferably, the board supporting member is supported on the stage so as to be capable of being raised and lowered, and provided is a mechanism for holding the board supporting member in its obliquely raised position.

Since the unacceptable portion can be corrected on the obliquely raised board, it becomes easy for the inspector to perform correcting work.

The image obtained by the imaging before the stage is drawn out is frozen and is displayed as a still image on the display device. The inspector can search for the unacceptable portion on the board by seeing the image.

A visual inspection supporting apparatus according to the present invention comprises an illuminating device for illuminating a printed circuit board to be inspected, an imaging device for imaging an area on the board illuminated by the illuminating device and outputting an image signal representing an image obtained by the imaging, a stage which is movable relatively to the illuminating device and the imaging device in two perpendicular directions, a movable body supported on the stage movably in either one of the two directions, and a board supporting member supported on the movable body for supporting the board to be inspected.

Since the board, along with the movable body, can be drawn out even by using this apparatus, it becomes easy to perform correcting work of an unacceptable portion.

A visual inspection supporting apparatus according to the present invention comprises an illuminating device for illuminating a printed circuit board to be inspected, an imaging device for imaging an area on the board illuminated by the illuminating device and outputting an image signal representing an image obtained by the imaging, a stage which is movable relatively to the illuminating device and the imaging device in two perpendicular directions, a rotating body rotatably supported on the stage, and a board supporting member supported on the rotating body for supporting the board to be inspected.

The board can be rotated in the use of this apparatus. Consequently, the apparatus is suitable for soldering inspection and correction of a part having a lead on four perpendicular sides.

These visual inspection supporting apparatuses and the board inspecting apparatuses further comprise storage means for storing previously taught position data representing a point to be inspected on a board to be inspected and display control means for performing control so as to indicate the point to be inspected on the image displayed on the display device in accordance with the position data stored in the storage means.

Consequently, a portion to be inspected is indicated, thereby improving the operating efficiency of the inspection.

The result of the inspection is immediately entered from an input device. A portion which is judged to be unacceptable as the result of the inspection is indicated on a screen of the display device.

More preferably, a layout display indicating the position on the board of an area of the image displayed on the display device is provided. Consequently, the inspector can find an area currently inspected, and can also grasp the progress of the inspection.

In order to make up the personal difference between inspectors to ensure objectivity, a scale for expressing the length is displayed on the image displayed on the display device.

Furthermore, two lines are movably displayed on the display screen of the display device, and the spacing between the two lines is calculated and is displayed.

Additionally, a window is displayed on the display screen of the display device, and data relating to the size of a particular image in the window is displayed. More preferably, data relating to the reference size is displayed in addition to the data relating to the size of the particular image.

The other features of the present invention will become more apparent from embodiments explained hereinbelow

BRIEF DESCRIPTION OF THE DRAWINGS

FIG. 1 is a perspective view of the entire apparatus, FIG. 2 is a perspective view showing a Y-axis table in enlarged form, FIG. 3 is a cross-sectional view showing in enlarged form a portion for fixing a movable plate, FIG. 4 is a perspective view showing a state where a board supporting member is raised;

FIG. 12 illustrates an example of a teaching table;

FIG. 14 illustrates an example of an image displayed in teaching processing;

FIG. 20 illustrates an example of an inspection-result table;

FIG. 29 illustrates an example in which the measured fillet length, along with the criterion in inspection, is displayed;

FIG. 30a is a cross-sectional view showing a lead, solder and a land, and FIG. 30b illustrates an image corresponding thereto;

FIGS. 33a and 34a are cross-sectional views showing solder and its vicinity, and FIGS. 33b and 34b illustrate an example of a displayed image corresponding thereto;

FIG. 36 is an enlarged perspective view of a Y-axis table, FIG. 37 is an enlarged cross-sectional view taken along a line VII—VII shown in FIG. 36, FIG. 38 is an enlarged cross-sectional view taken along a line VIII—VIII shown in FIG. 36, FIG. 39 is an enlarged cross-sectional view taken along a line IX—IX shown in FIG. 36, and FIG. 40 is a perspective view showing a state where a board supporting member is raised;

FIG. 45 is a block diagram showing a system in which a soldering correcting apparatus is combined with an automatic board inspecting apparatus.

BEST MODE FOR CARRYING OUT THE INVENTION (1) Mechanical Construction of Visual Inspection Supporting Apparatus (Part 1)

An example of the mechanical construction of a visual inspection supporting apparatus for assisting in work for visually inspecting a printed circuit (PC) board on which parts are mounted for acceptability of soldering is illustrated in FIGS. 1 to 4.

A printed circuit board on which electronic parts are mounted is generally manufactured through a mounting step for disposing and positioning an electronic part (hereinafter merely referred to as a "part") on a printed circuit board (hereinafter merely referred to as a "PC board" or "board"), a soldering step using soldering methods such as a flow soldering method and a reflow soldering method, a soldering inspecting step for judging whether or not soldering is acceptable, and a soldering correcting step for correcting a soldered portion which is judged to be unacceptable. No soldering correcting step is, of course, required with respect to a PC board having no unacceptable soldered portion. The soldering step and the subsequent steps may, in some cases, be performed again with respect to a PC board having a soldered portion difficult or impossible to correct.

The visual inspection supporting apparatus is used for either one or both of the soldering inspecting step and the soldering correcting step. That is, the visual inspection supporting apparatus is used for assisting an inspector (a worker) in performing work for visually inspecting a soldered portion on a PC board for acceptability and assisting a worker (an inspector) in performing manual work for correcting an unacceptable soldered portion. As apparent from the following, an unacceptable portion can be corrected after visual inspection of one or a plurality of PC boards is completed, and an unacceptable portion can be also corrected every time the unacceptable portion is found out in visual inspection of one PC board.

Figure 1:
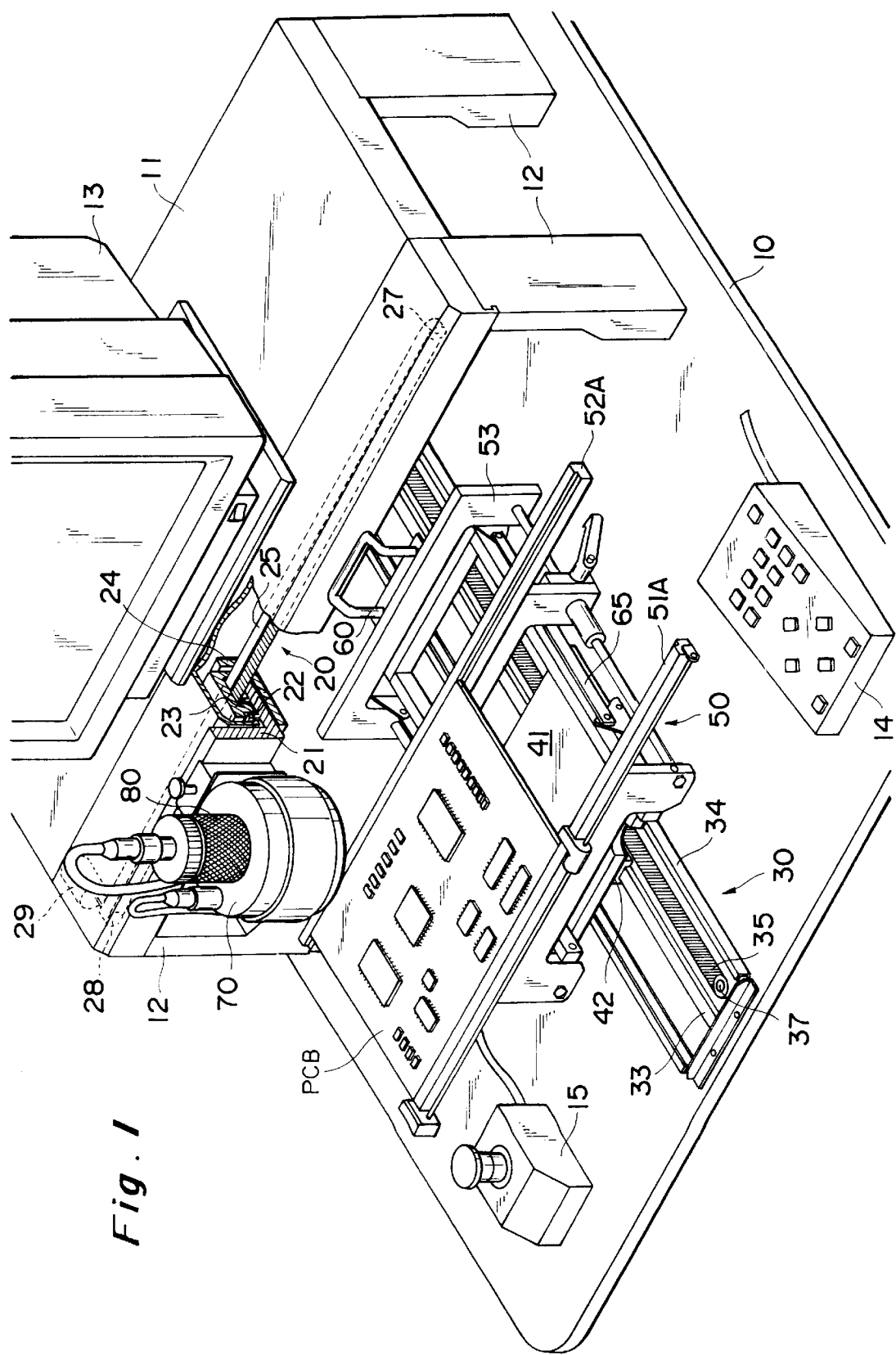
FIGS. 1 to 4 illustrate an example of the mechanical construction of a visual inspection supporting apparatus (Part 1)
Figure 2:
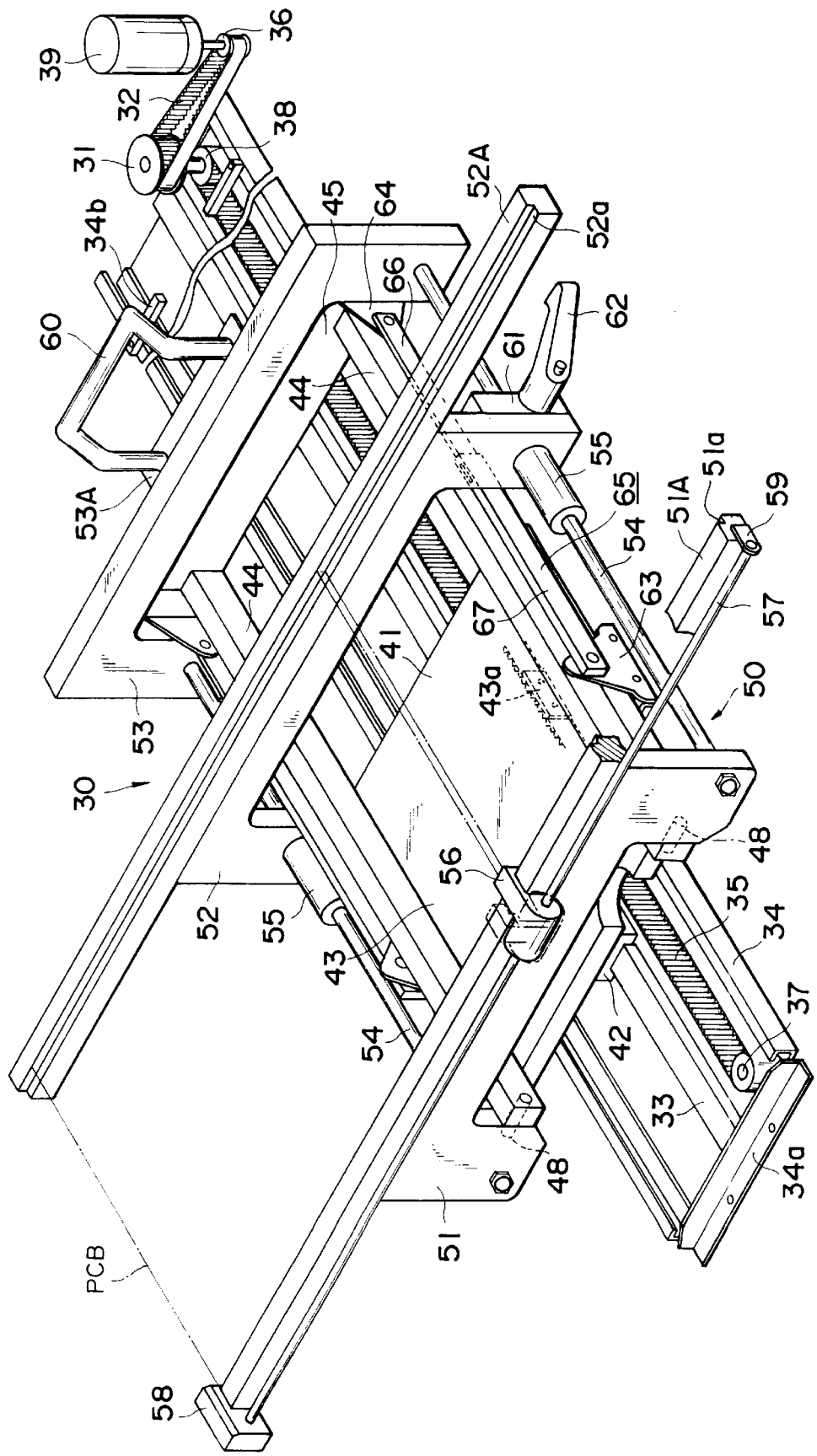

Particularly referring to FIGS. 1 and 2, a fixed table 11 is positioned on the rear half of a base 10, and legs 12 of the table 11 are secured to the base 10. The upper surface of the table 11 is higher in position than the base 10, and a CRT display device 13 is disposed on the upper surface of the table 11.

An X-axis table 20 is provided along the front edge of the table 11. In addition, a Y-axis table 30 is provided on the base 10 in such an arrangement as to perpendicularly cross the X-axis table 20. The X-axis table 20 moves in the X-axis direction and positions a light projecting device 70 and an imaging device 80. The Y-axis table 30 moves in the Y-axis direction and positions a PC board PCB.

The X-axis table 20 is mounted on the lower surface of the front edge of the table 11, and comprises an X-axis rail 23 and a supporting rail 24 extending in the transverse direction (the X-axis direction). An X stage 21 is provided with a slider 22. The slider 22 is slidably fitted to the X-axis rail 23. A portion including the slider 22 of the X stage 21 is slidably supported on the supporting rail 24.

An endless timing belt 25 is disposed along the X-axis rail 23. The timing belt 25 is reeved around pulleys (gears) 27 and 28 each having teeth on its peripheral surface. The pulley 27 is rotatably mounted on the lower surface of the table 11 at one end thereof, and the pulley 28 is fixed to the rotational shaft of an X-axis motor (a DC motor) 29. The motor 29 is fixed to the lower surface of the table 11. The timing belt 25 is attached to the X stage 21 at its one portion.

By driving the motor 29, the X stage 21 is moved rightward and leftward along the X-axis rail 23 via the timing belt 25 and is placed in an arbitrary position. The light projecting device 70 and the imaging device 80 are mounted on the X stage 21.

The Y-axis table 30 comprises a Y-axis rail 33 secured to the base 10. The Y-axis rail 33 perpendicularly crosses the X-axis rail 23.

A Y stage 41 comprises a supporting plate 43, a sliding member 42 fixed to the lower surface of the supporting plate 43, side members 44 formed integrally with the supporting plate 43 on both sides thereof and extending in the longitudinal direction (the Y-axis direction), and a rear member 45 fixed between the rear ends of the side members 44. The sliding member 42 is slidably fitted to the Y-axis rail 33.

An endless timing belt 35 is disposed along the Y-axis rail 33. Pulleys (gears) 37 and 38 each having teeth formed on its peripheral surface are rotatably provided at the front end and the rear end of the base 10, respectively. The timing belt 35 is reeved around the pulleys 37 and 38. A portion of the timing belt 35 is attached to a bracket 43a fixed to the lower surface of the supporting plate 43.

A pulley 31 and the pulley 38 at the rear of the base 10 are secured to a common shaft. On the other hand, a pulley 36 is fixed to the rotational shaft of a Y-axis motor (a DC motor) 39. A timing belt 32 is reeved around the pulleys 31 and 36. The common rotational shaft of the pulleys 31 and 38 is rotatably supported by a suitable bearing (not shown). The bearing and the motor 39 are fixed to the base 10 by a fixing member (not shown).

A frame 34 is provided around the Y-axis rail 33 and the timing belt 35. The frame 34 is fixed to the base 10. A stopper 34a and a stopper 34b are respectively fixed to the front end and the rear end of the frame 34. The stoppers 34a and 34b regulate the movement range of the Y stage 41. A cover (not shown) is attached to the frame 34 in such a manner as not to prevent the movement of the Y stage 41.

By driving the Y-axis motor 39, the Y stage 41 is moved back and forth along the rail 33 via the timing belts 32 and 35 and is placed in an arbitrary position.

A board supporting body 50 is mounted on the Y stage 41 so as to be capable of being raised and lowered. The board supporting body 50 comprises a front plate 51, a movable plate 52, a rear plate 53, and rods 54. Each of the front plate 51 and the movable plate 52 has leg portions extending downward from both ends thereof. Supporting arms 51A and 52A horizontally extending in the transverse direction (the rightward/leftward direction) are integrally formed in the upper portions of the front plate 51 and the movable plate 52, respectively. The rear plate 53 has leg portions extending downward from both ends thereof. The leg portions of the front plate 51 and the leg portions of the rear plate 53 are respectively connected by the rods 54. Both ends of the rod 54 are respectively fixed to the leg portions of the front plate 51 and the rear plate 53.

Cylinders 55 are perpendicularly fixed to the leg portions of the movable plate 52, respectively. The leg portions of the movable plate 52 are respectively provided with holes corresponding to through holes of the cylinders 55. The rods 54 slidably pass through the through holes of the cylinders 55 and the holes of the leg portions, respectively. Consequently, the movable plate 52 is movable along the rods 54 between the front and rear plates 51 and 53.

Figure 3:
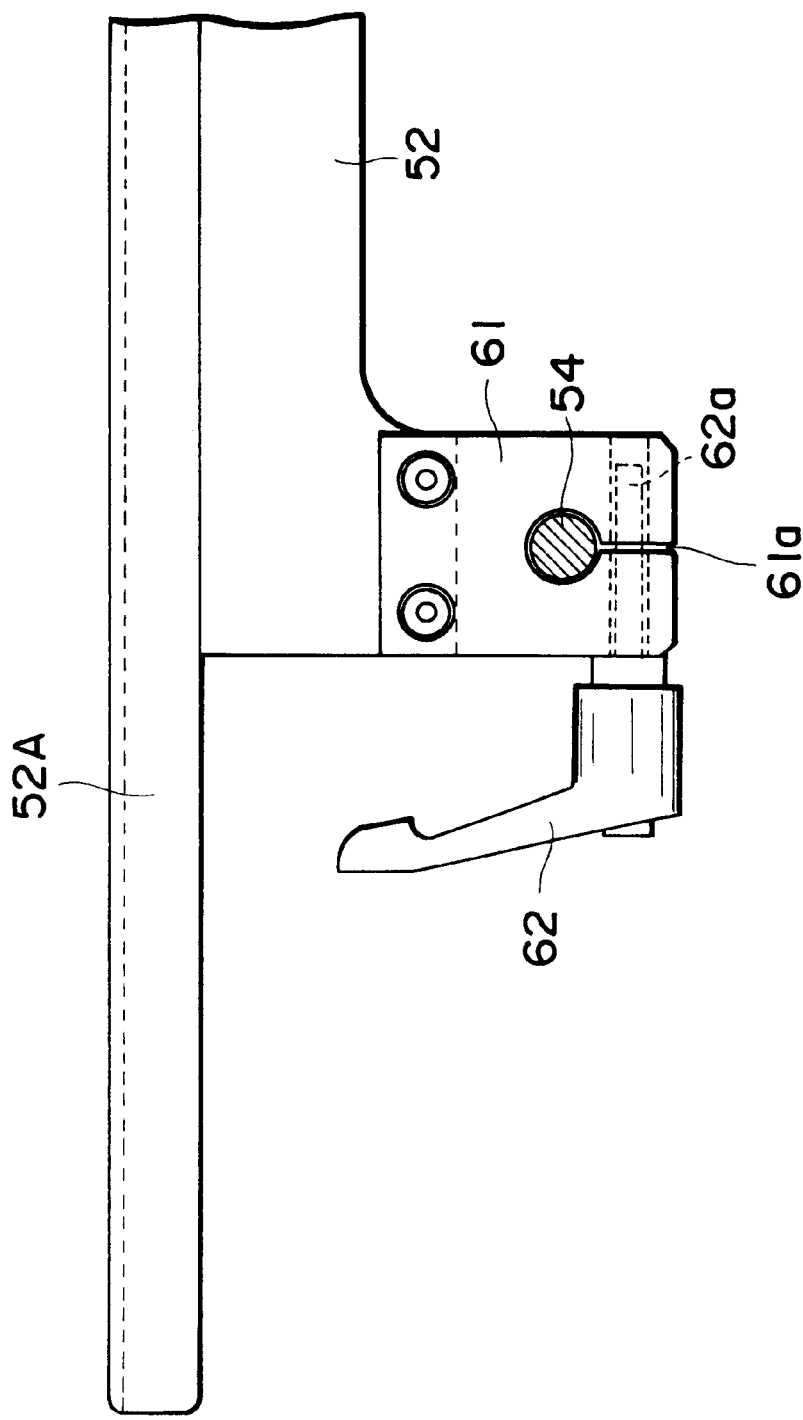

As shown in FIG. 3, a splitted piece 61 is fixedly attached to one of the leg portions of the movable plate 52, on a surface opposite to the surface where the cylinder 55 is mounted, of the movable plate 52. The splitted piece 61 also has a hole through which the rod 54 slidably passes, and a slit 61a is formed downward from the hole. A screw hole is formed in a direction perpendicular to the slit 61a, and a screw 62a integrally secured to a lever 62 is fitted in the screw hole. The screw 62a is screwed in the screw hole by means of the lever 62, whereby the hole of the splitted piece 61 is reduced in size to tighten the rod 54. Consequently, the movable plate 52 is fixed.

Receiving steps 51a and 52a are respectively formed on the upper portions of the supporting arms 51A and 52A formed in the front plate 51 and the movable plate 52 at inside thereof along the longitudinal direction of the supporting arms. A receiving piece 58 and a bracket 59 are, respectively, fixedly attached to one end and the other end of the supporting arm 51A of the front plate 51, and a shaft 57 is fixed at both ends thereof to the receiving piece 58 and the bracket 59. The shaft 57 is parallel to the supporting arm 51A with small spacing. A pressing piece 56 is slidably and rotatably mounted on the shaft 57.

The PC board PCB is received between the receiving step 51a of the supporting arm 51A and the receiving step 52a of the supporting arm 52A. The position of the movable plate 52 is so adjusted that the PC board PCB just stays between the receiving steps 51a and 52a, and the movable plate 52 is fixed by means of the lever 62. The PC board PCB is brought leftward and is placed in a position abutting against the receiving piece 58. The pressing piece 56 is moved to a position abutting against the right end of the PC board PCB. A permanent magnet is embedded in the front end of the pressing piece 56, and the front plate 51 is formed of a magnetic material (for example, iron). If the pressing piece 56 is moved along the shaft 57 in a state where it is raised as indicated by a one-dot and dash line in FIG. 2, and is laid down in the position abutting against the right end of the PC board PCB, the permanent magnet attracts the front plate 51, whereby the pressing piece 56 is fixed. The PC board PCB is fixed in a state where it is received by the receiving steps 51a and 52a and put between the receiving steps 51a and 52a and between the receiving piece 58 and the pressing piece 56. If the front plate 51 is not formed of a magnetic material, a magnetic plate may be fixedly attached along the supporting arm 51A.

The front plate 51 of the board supporting body 50 is attached at both leg portions thereof rotatably (so as to be capable of being raised and lowered) to the front ends of the side members 44 of the Y stage 41 by shafts 48. In a state where the board supporting body 50 is lowered (a state shown in FIG. 2), a block 53A fixed to the rear side of the rear plate 53 of the board supporting body 50 abuts against and is received by the rear member 45 of the Y stage 41. A handle 60 extending upward is mounted on the block 53A, and a permanent magnet 46 is embedded in the lower surface of the block 53A. On the other hand, a magnetic sensor (for example, a Hall element) 47 is embedded, at a location, which corresponds to the permanent magnet 46, in the rear member 45 of the Y stage 41. If the board supporting body 50 is in the state shown in FIG. 2, the magnetic sensor 47 detects the permanent magnet 46, to output a detection signal. Consequently, it is possible to recognize that the board supporting body 50 is in its lowered position (horizontal position). It goes without saying that the magnetic sensor may be replaced with another sensor (a limit switch or the like).

Brackets 63 are fixedly attached to the front portions of the side members 44 of the Y stage 41 and brackets 64 are attached to the leg portions of the rear plate 53 of the board supporting body 50. A stay 65 comprises a guide 67, a shaft 66 removably inserted into the guide 67, and a latch mechanism for fixing the shaft 66 to a predetermined position of the guide 67. The base end of the guide 67 of the stay 65 and the top end of the shaft 66 are pivoted on the bracket 63 and the bracket 64, respectively.

Figure 4:
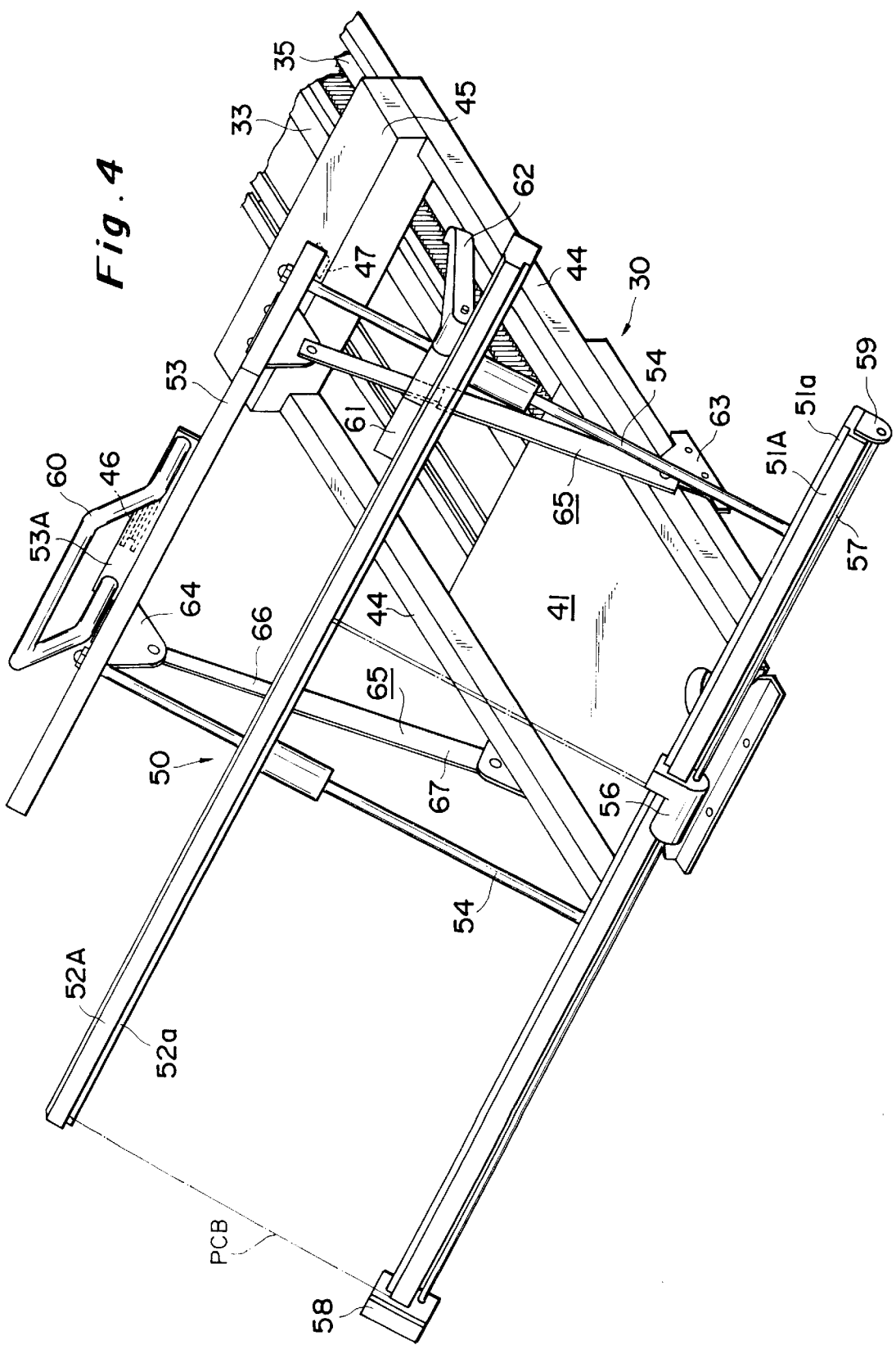

The rear end of the board supporting body 50 can be pulled up, with the handle 60 in hand. The board supporting body 50 is raised, rotating about the shaft 48. After the board supporting body 50 is pulled up to a suitable height, the end thereof is slightly lowered, then the latch mechanism of the stay 65 operates so that the stay 65 stretches. Consequently, the board supporting body 50 is held in its obliquely raised state, as shown in FIG. 4.

Thereafter, when the rear end of the board supporting body 50 is slightly pulled up by means of the handle 60, the latch mechanism of the stay 65 is released, whereby the board supporting body 50 is returned to the horizontal position as shown in FIG. 2. In a state where the board supporting body 50 is obliquely raised, the magnetic sensor 47 cannot detect the permanent magnet 46.

In FIG. 1, a keyboard 14 for inspection and an emergency stop switch 15 are further put on the base 10. The keyboard 14 and the switch 15 are connected to a controller, as described later. The keyboard 14 for inspection and the emergency stop switch 15 are used in inspecting a PC board. When a teaching operation as described later is performed, a mouse and a keyboard for teaching are put on the base 10.

Although the construction of the stay 65 functioning as described above has already been known, the construction and the function will be briefly described with reference to FIGS. 5a to 5d and FIGS. 6a to 6d.

Figure 5A:
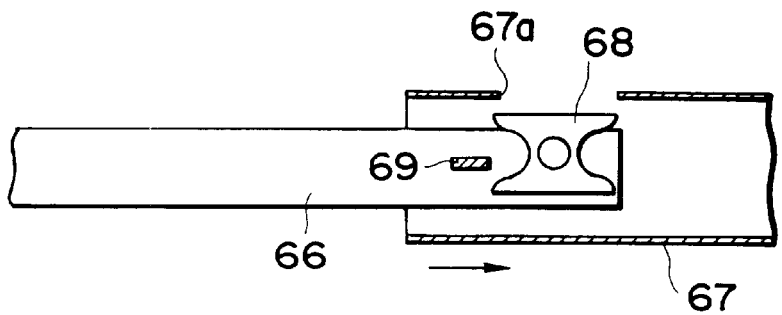
FIGS. 5a to 5d and FIGS. 6a to 6d are cross-sectional views showing the construction and the operation of a stay for holding a board supporting member in its raised state.

In FIG. 5a, the guide 67 is a hollow prism (rectangular in cross section), and the shaft 66 is inserted into the guide 67 from an opening end of the guide 67 (an end on the opposite side of the base end, which is attached to the bracket 63, of the guide 67). The guide 67 is formed with an opening 67a in the vicinity of the opening end on a side surface thereof. A stopper 68 having four claws is rotatably provided at the base end of the shaft 66 (an end on the opposite side of the top end, which is attached to the bracket 64, of the shaft 66). In addition, the guide 67 is provided with a projection 69 outside of the stopper 68, and the projection 69 is projected into the guide 67. The stopper 68 and the projection 69 constitute a latch mechanism.

Figure 5B:
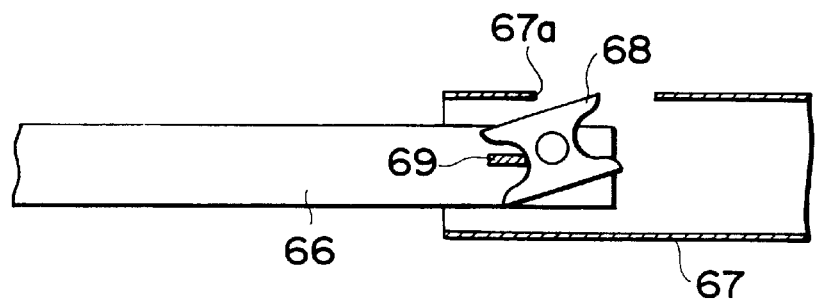
Figure 5C:
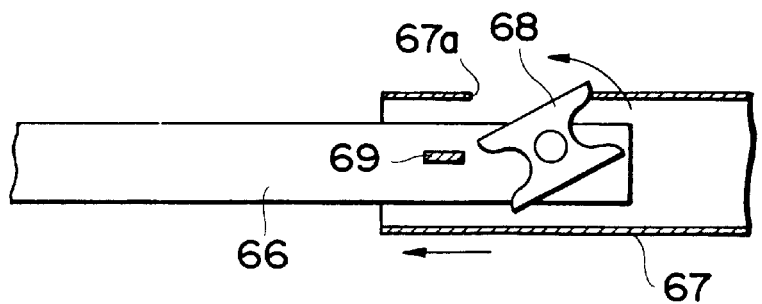
Figure 5D:
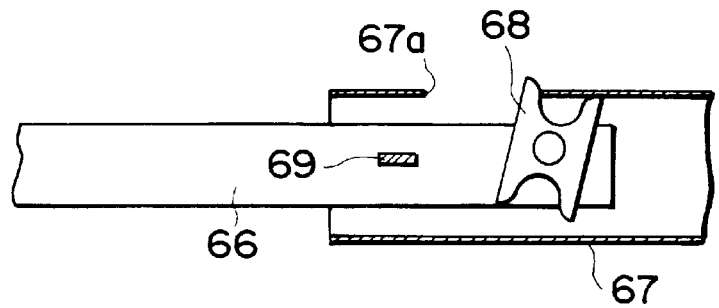

In a process for obliquely raising the board supporting body 50 from its laid position, the stay 65 operates, as shown in FIGS. 5a to 5d. When the guide 67 moves rightward (the shaft 66 moves leftward), the stopper 68 rotates in a counterclockwise direction in contact with the projection 69, and one of the claws of the stopper 68 is projected outward from the opening 67a (the guide 67 can not move rightward from this position) (FIG. 5b). When the guide 67 is returned leftward, the claw projected outward from the opening 67a is brought into contact with an edge of the opening 67a, whereby the stopper 68 rotates in a counterclockwise direction (FIG. 5c). One of the claws of the stopper 68 and the adjacent claws are respectively brought into contact with the edge of the opening 67a and the inner surface of the guide 67, whereby the guide 67 can not further move leftward from this position (the shaft 66 can not move rightward) (FIG. 5d). Consequently, the board supporting body 50 is kept in its obliquely raised position.

When the board supporting body 50 is slightly pulled up, the handle 60 in hand as described above, the latch mechanism is released, whereby the board supporting body 50 is returned to the horizontal position. This process is illustrated in FIGS. 6a to 6d.

When the guide 67 moves rightward from the state of FIG. 5d, the stopper 68 abuts against the projection 69 to rotate in a counterclockwise direction (FIGS. 6a to 6b) (the guide 67 can not further move rightward from this position). When the guide 67 then moves leftward, the claw of the stopper 68 projected outward from the opening 67a abuts against the edge of the opening 67a, whereby the stopper 68 rotates in a counterclockwise direction, to enter the guide 67

Figure 6A:
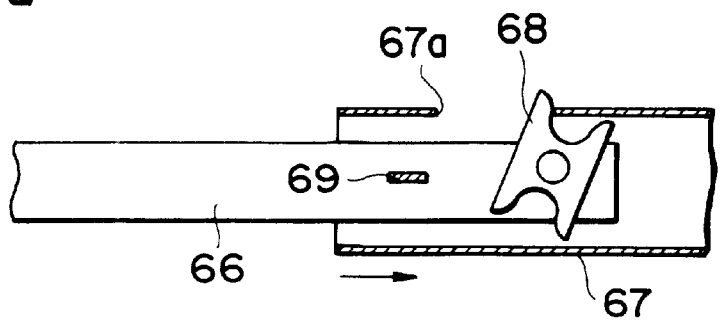
Figure 6B:
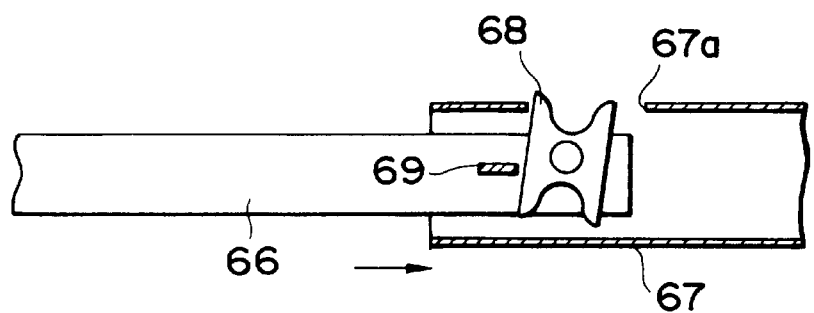
Figure 6C:
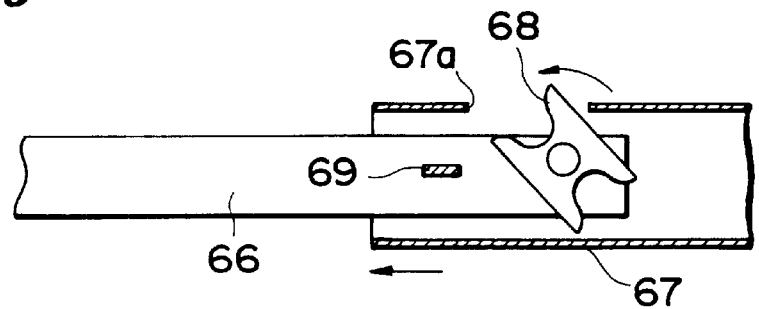
Figure 6D:
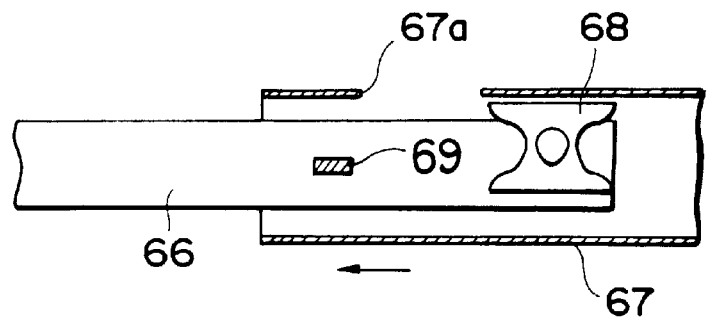

(FIG. 6c). In this state, the guide 67 can move leftward (the shaft 66 can move rightward) (FIG. 6d).

(2) Light Projecting Device and Imaging Device (Part 1 and Part 2)

Figure 7:
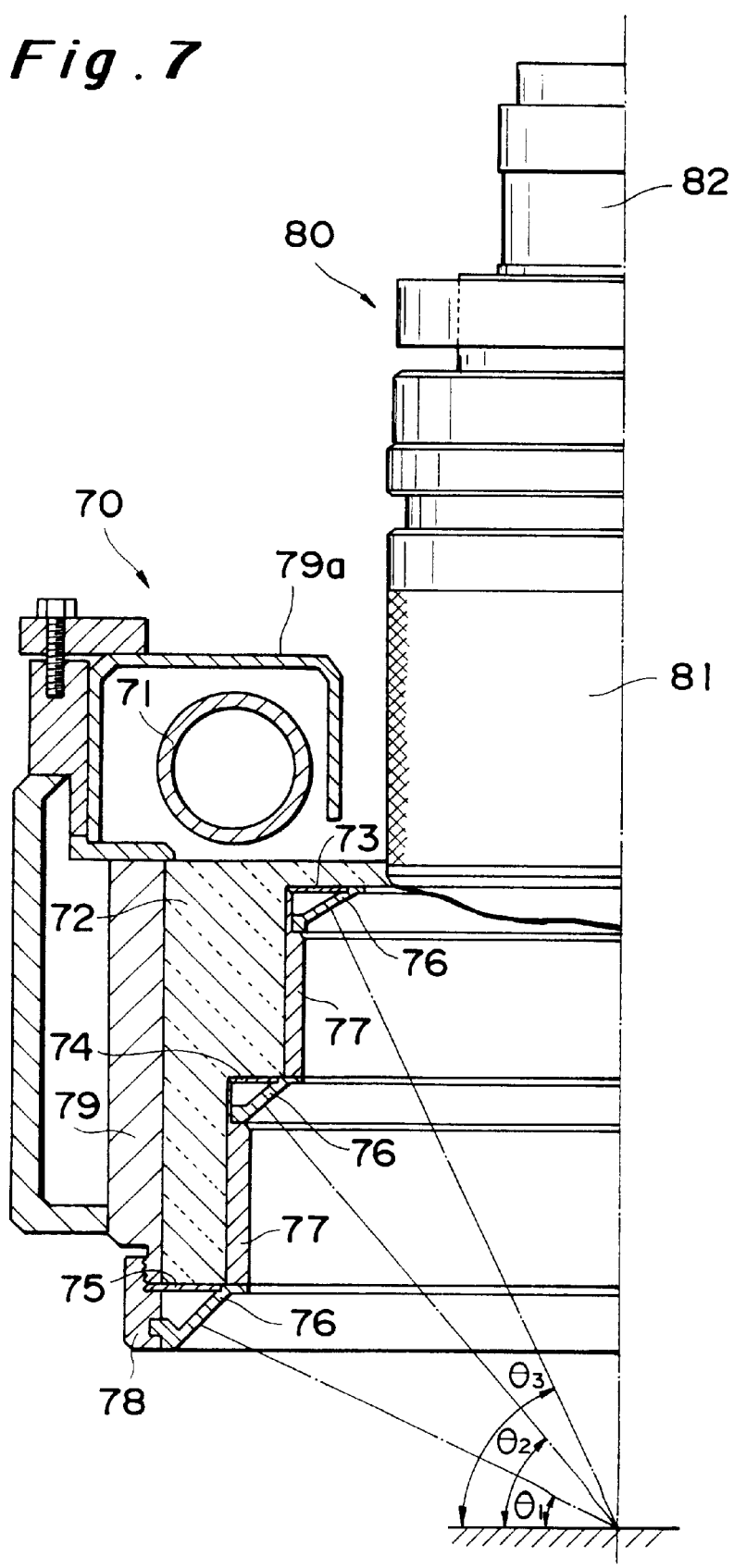
FIG. 7 is a cross-sectional view showing the construction of a light projecting device and an imaging device (Part 1)

An example of the construction of a light projecting device 70 will be described with reference to FIG. 7. A ring-shaped fluorescent lamp 71 is arranged in the upper portion of a cylindrical case 79 inside thereof. The fluorescent lamp 71 is covered with a cover 79a. A ring-shaped photoconductor (made of acrylic, for example) 72 is provided below the fluorescent lamp 71. The inner peripheral surface of the photoconductor 72 is formed in a three-stepped shape. The portion of the uppermost step is the thickest and the lower the position is, the thinner the portion becomes. This peripheral surface of the photoconductor 72 is also in a ring shape.

A red (R) color filter 73, a green (G) color filter 74, and a blue (B) color filter 75 are respectively positioned on the lower surface of the uppermost step, the lower surface of the middle step and the lower surface of the photoconductor 72. Diffusing plates 76 having slopes are respectively arranged inside of the color filters 73 to 75. A black ring-shaped wall 77 is provided between the upper and lower diffusing plates 76. The color filters 73 to 75 are also in a ring shape, and the diffusing plates 76 are also in a ring shape. The R filter 73, the diffusing plate 76, the ring-shaped wall 77, the G filter 74, the diffusing plate 76, the ring-shaped wall 77, the B filter 75, and the diffusing plate 76 are successively fitted, and a stop ring 78 is finally screwed into the case 79, whereby the inner peripheral surface of the light projecting device 70 is assembled.

Light emitted from the fluorescent lamp 71 passes through the photoconductor 72, to reach the R, G and B color filters 73 to 75, where the light is converted into R light, G light and B light, and the R light, G light and B light are diffused by the diffusing plates 76 and are directed downward. The R light, G light and B light projected downward through the color filters 73 to 75 differ in the angle of projection. Letting θ3, θ2 and θ1 be angles formed by a horizontal surface of an object positioned just below the center of the light projecting device 70 (which coincides with the center of an imaging device 80) and the directions of projection of the R light, G light and B light, respectively, the relationship of θ3>θ2>θ1 holds. An image formed by light reflected from the object is picked up by the imaging device 80 positioned just above the object. When the surface of the object is near to horizontal, the red reflected light is the strongest of the light incident on the imaging device. The larger the angle of inclination of the surface of the object from the horizontal surface is, the stronger the reflected green light and blue reflected light become. The angles of inclination of the surface of the object are thus represented in different colors on the image picked up.

Preferably, the emission spectrum of the fluorescent lamp, the transmission rates of the color filters 73 to 75, and the like are so determined that the R light, G light and B light are mixed to generate white light.

The imaging device 80 is fixed to the upper portion in the center of the light projecting device 70, and comprises a zoom lens system (a lens cylinder) 81 and a camera head 82. The camera head 82 includes a CCD (solid state electronic imaging device). The zoom lens system 81 causes light reflected from an object positioned just below the zoom lens system 81 to be formed on the CCD of the camera head 82. The zoom magnification can be manually changed.

Figure 8:
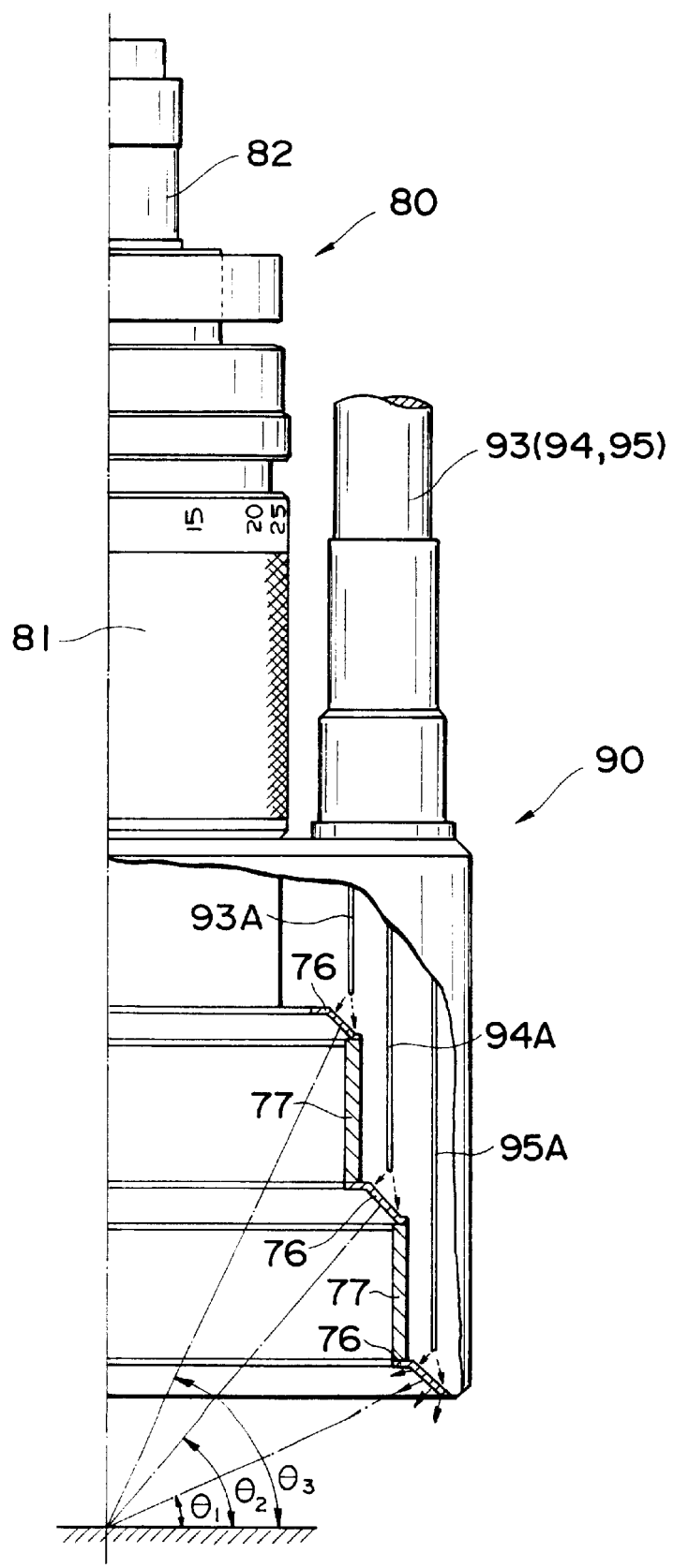
FIG. 8 is a cross-sectional view showing the construction of a light projecting device and an imaging device (Part 2)
Figure 9:
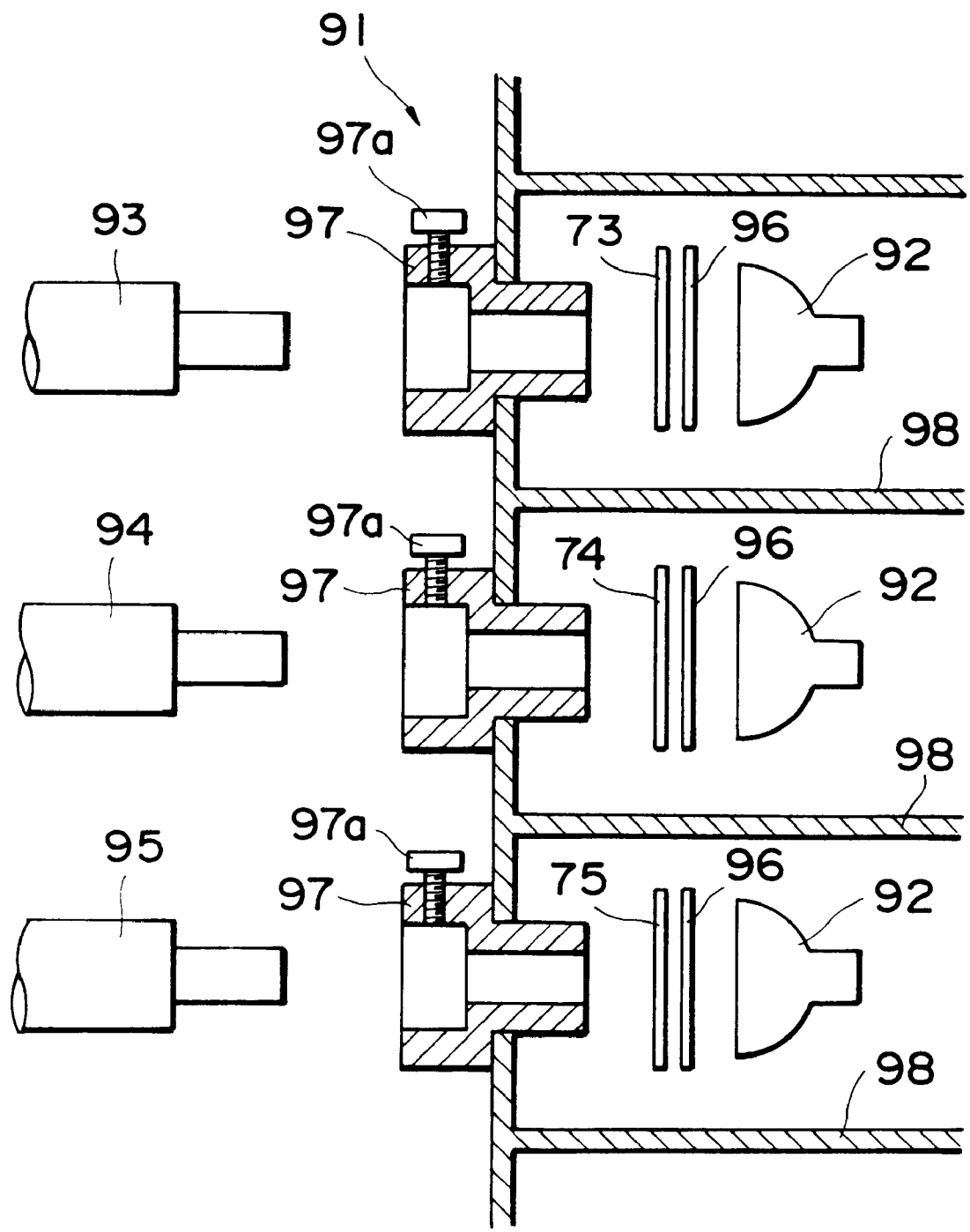
FIG. 9 illustrates the construction of a light source equipment to which the light projecting device shown in FIG. 8 is connected.

FIG. 8 illustrates another example of the construction of a light projecting device. FIG. 9 illustrates the construction of a light source equipment. An imaging device is the same as the above described one.

In a light projecting device 90, there are provided no color filters and fluorescent lamp. Three optical fiber cables 93 to 95 are introduced into the light projecting device 90 from a light source equipment 91. Each of the optical fiber cables 93 to 95 is obtained by bundling a lot of fine optical fibers and coating the periphery thereof. The optical fiber cable 93 is for introducing red light, and a lot of optical fibers 93A thereof are arranged at a predetermined spacing in a ring shape so that their tips (light is projected from the tips) are positioned above the diffusing plate 76 in the upper most step. Similarly, the optical fiber cables 94 and 95 are for respectively introducing green light and blue light, and a lot of optical fibers 94A of the cable 94 and a lot of optical fibers 95A of the cable 95 are respectively arranged at a predetermined spacing in a ring shape so that their tips are positioned above the diffusing plates 76 in the middle step and the lower step. Even such the light projecting device 90 is used, it is possible to illuminate an object just below the light projecting device 90 at different angles and in different colors.

In FIG. 9, three halogen lamps (light sources) 92 are arranged in the light source equipment 91, and the light sources 92 are shielded from each other by partition walls 98. Heat preventing glass 96 and color filters (R, G, B) 73, 74 and 75 are respectively arranged ahead of the light sources 92. Connectors 97 of the optical fiber cables are further respectively provided ahead of the color filters 73 to 75. The optical fiber cables 93 to 95 are respectively inserted into the connectors 97 and are fixed by screws 97a, so that the R light, G light and B light are respectively introduced into the optical fiber cables 93, 94 and 95.

The light source equipment 91 has features that the optical fiber cables 93 to 95 can be respectively connected to the arbitrary connectors 97. Consequently, the angles of projection of the R light, G light and B light in the light projecting device 90 can be switched. For example, if the optical fiber cable 93 is connected to the connector 97 ahead of the blue color filter 75, the blue light can be projected at the greatest angle θ3 from a position in the uppermost step in the light projecting device 90. The light projecting device 90 can be also changed into a light projecting device of two colors or one color by omitting one or two optical fiber cables.

Furthermore, the intensities of light emission of the three light sources 92 are electrically controlled, whereby the intensities of the R light, G light and B light projected in the light projecting device 90 can be so adjusted that the R light, G light and B light are mixed to generate white light.

(3) Electrical Construction of Visual Inspection Supporting Apparatus (Part 1)

Figure 10:
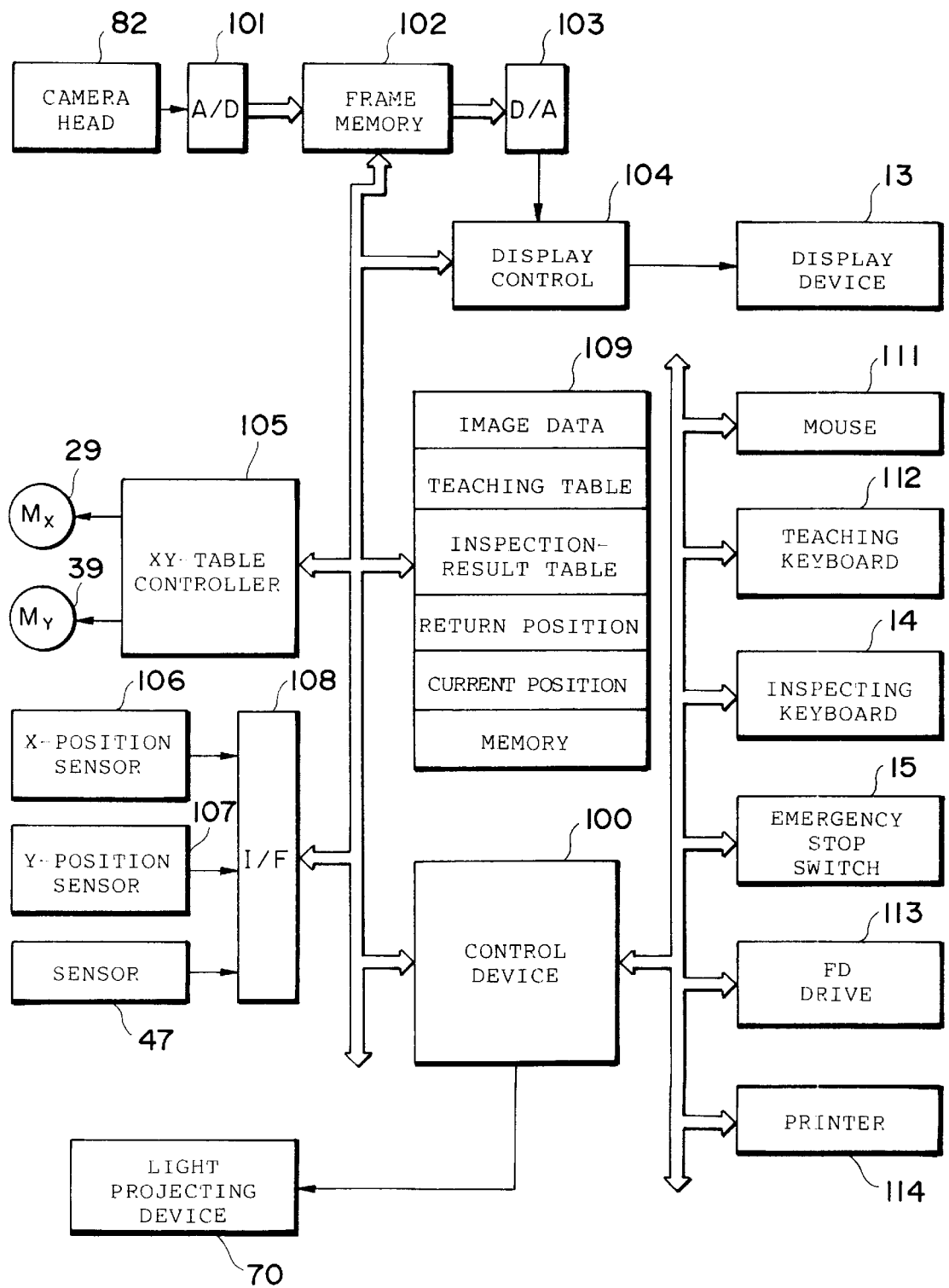
FIG. 10 is a block diagram showing the electrical construction of the visual inspection supporting apparatus (Part 1)

FIG. 10 illustrates an example of the electrical construction of the visual inspection supporting apparatus. The visual inspection supporting apparatus is controlled by a computer system. The main body of a computer including a CPU to be the heart of the computer system is illustrated as a controller 100. Interface circuits for connecting input/output devices shall be included in the controller 100 as required.

The visual inspection supporting apparatus has mainly the teaching mode and the inspection mode. Even in either one of the modes, performed are the driving of the X-axis table 20 and the Y-axis table 30, the imaging of the PC board PCB, the displaying of an image obtained by the imaging, and so on.

The camera head 82 of the imaging device 80 includes a color CCD serving as an imaging device as described above, and circuits such as a circuit for processing a video signal outputted from the CCD (circuits for white balance adjustment, and gamma correction, a matrix circuit for producing R, G and B signals, and the like). The video signal outputted from the camera head 82 is converted into digital image data (generally, R, G and B image data) in an A/D converter (comprising three A/D converters for R, G and B) 101. The digital image data are stored once in a frame memory 102. The digital image data read out from the frame memory 102 are converted into an analog video signal by a D/A converter 103. The analog video signal is fed to a CRT display device 13 through a display control circuit 104. Preferably, the frame memory 102 can write and read out data simultaneously, and an image picked up by the camera head 82 is always displayed on the display device 13.

The display control circuit 104 produces image data representing a cursor, a mark as described later, a display of layout on the entire PC board, a scale and the like, and displays the image data one over the other on a screen of the display device 13 under the control of the controller 100.

The X-axis motor 29 and the Y-axis motor 39 are controlled by a XY table controller 105 on the basis of a command of the controller 100.

The current position of the X-axis table 20 and more precisely, the X-coordinate of the center of the visual field of the imaging device 80 mounted on the X stage 21 is detected by an X position sensor 106. Similarly, the current position of the Y-axis table 30, that is, the Y-coordinate of the center of the visual field of the imaging device 80 is detected by a Y position sensor 107. The position sensors 106 and 107 are, for example, rotary transducers, and are mounted on the rotational shafts of the X-axis table 20 and the Y-axis table 30, for example, the rotational shaft of the motor 29 or the shaft of the pulley 31. An X position signal representing the X-coordinate outputted from the X position sensor 106, a Y position signal representing the Y-coordinate outputted from the Y position sensor 107, and a detection signal outputted from the magnetic sensor 47 and indicating that the board supporting body 50 is in its horizontal position are inputted to the controller 100 via an interface 108. The turning-on or -off of the power supply of the light projecting device 70 is also controlled by the controller 100.

In the teaching mode, a mouse 111 and a keyboard 112 for teaching are used for entering various data and commands. The mouse 111 is for designating the position and the size of a cursor, a mark or the like displayed on the CRT display device 13. The teaching keyboard 112 includes a key for entering a command to move the X-axis table 20 and the Y-axis table 30 (hereinafter collectively referred to as an XY table) in addition to keys for entering the board name, the board size, the zoom magnification, and the confirmation of entry.

In the inspection mode, the inspecting keyboard 14 and the emergency stop switch 15 are used for entering various data and commands. The teaching keyboard 112 is also used as required. The inspecting keyboard 14 is provided with keys such as a key for moving a mark on a display screen (the preceding point and the succeeding point), a key for moving the XY table to the preceding or succeeding inspection area (the preceding inspection area and the succeeding inspection area), a key for moving the XY table back and forth and rightward and leftward, a key for entering a code representing unacceptable soldering, a draw command key for issuing a command to draw out the Y stage 41 forward (toward a worker), and a return key for entering a command to return the Y stage 41 to the original position. The emergency stop switch 15 is depressed in driving the XY table. That is, the XY table is not moved even if a movement command is entered from the inspecting keyboard 14, unless the switch 15 is turned on. This is for the purpose of safety of work (the worker cannot move the XY table without using both his or her hands).

A memory 109 accompanied to the controller 100 is provided with an area storing image data representing an image indicating a standard (or on the limit) soldered state of a part mounted on a reference PC board, an area storing a teaching table created in the teaching processing as described later, an area storing an inspection-result table produced in the inspecting processing, an area storing a position to which the Y stage 41 is to be returned before being drawn out (a return position), an area storing the current position (the X and Y coordinates) of the XY table, a working area, and other areas.

The teaching table created in the teaching processing and the inspection-result table produced in the inspecting processing are stored in a floppy disk or are printed out after the termination of the processing. A floppy disk (FD) drive 113 and a printer 114 are connected to the controller 100 in order to save and output the data.

(4) Teaching Processing

Figure 11:
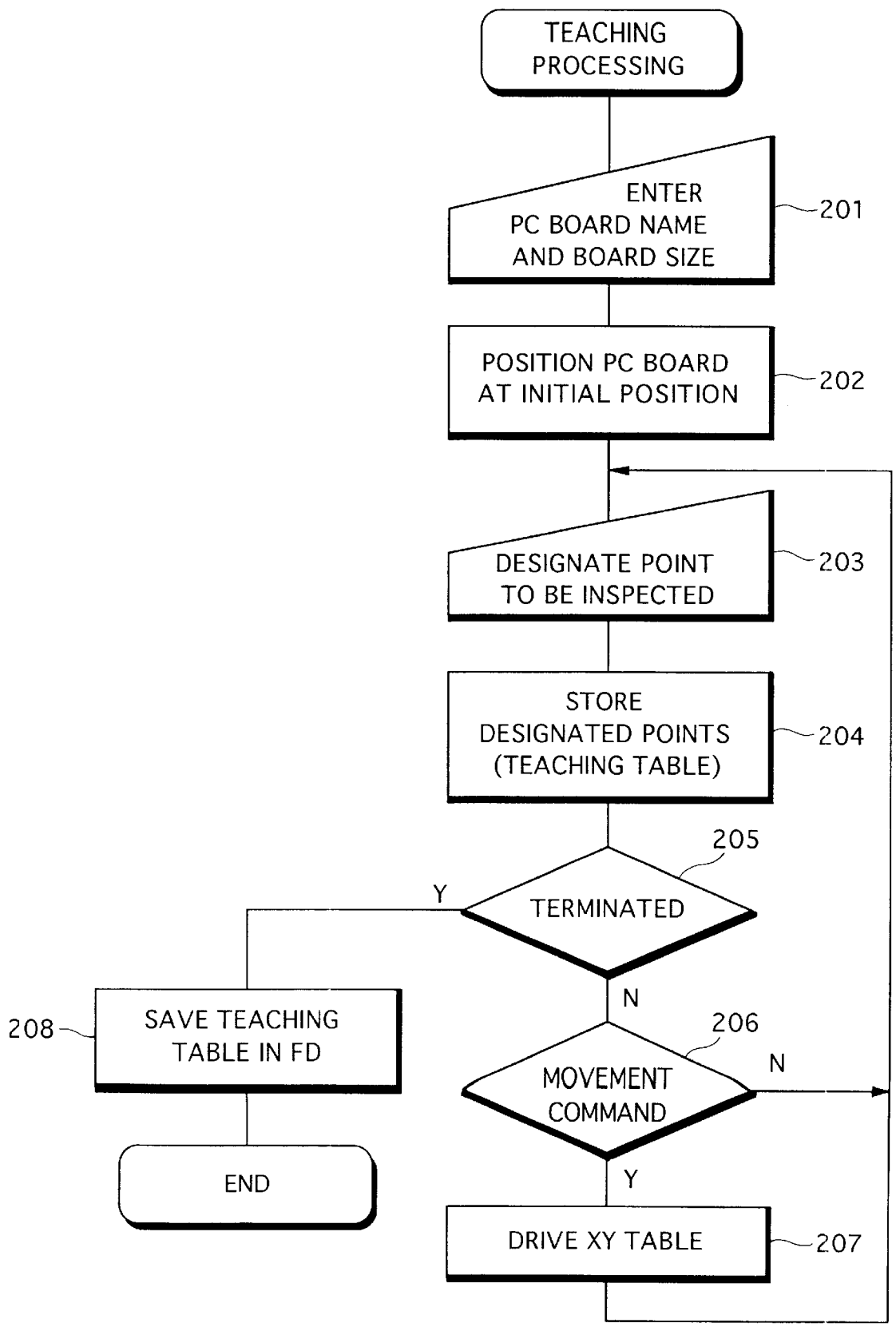
FIG. 11 is a flow chart showing the procedure for teaching processing.

FIG. 11 shows operations in the teaching mode (teaching processing) in the visual inspection supporting apparatus. The teaching processing is mainly supervised by the controller 100. FIG. 12 shows one example of the teaching table produced in the teaching processing.

In the teaching mode, a reference PC board to which parts are suitably soldered is used. The reference PC board is first set in the receiving steps 51a and 52a of the supporting arms 51A and 52A of the board supporting body 50. The board name (the type name representing the type of board, the number and the like) and the board size of the reference PC board are entered from the teaching keyboard 112 (step 201). The board size is useful in providing a display of layout on the PC board.

When an initial positioning command is entered from the teaching keyboard 112, the XY table is positioned at its initial position (step 202). The initial position is a position where a predetermined location, for example, the lower left corner of the PC board set in the board supporting body 50 is positioned in the center of the visual field (field of vision) of the imaging device 80.

The entire PC board does not generally enter in the visual field of the imaging device 80. Therefore, the entire PC board is divided into a plurality of areas each corresponding to a visual field. The range corresponding to one visual field becomes one inspection area.

Figure 13:
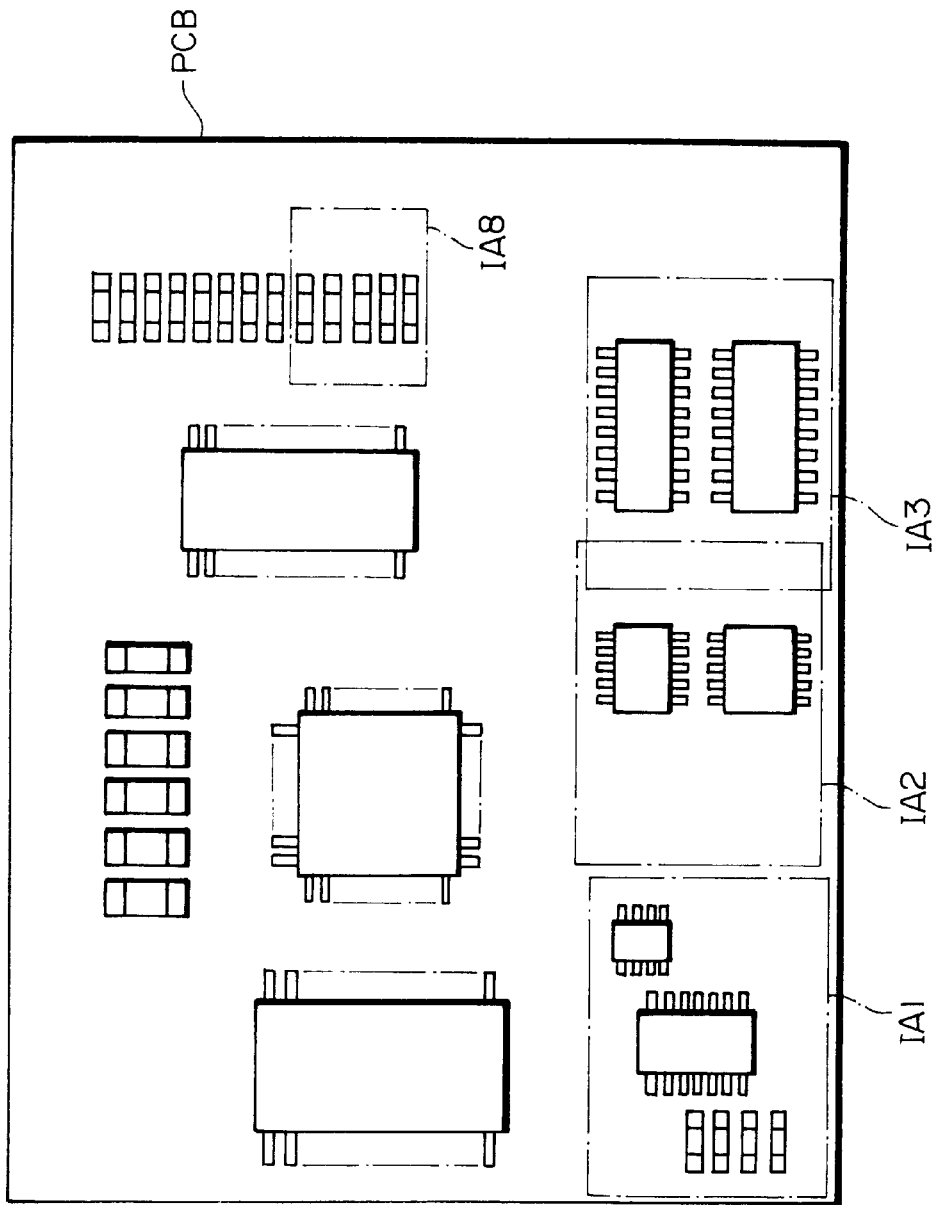
FIG. 13 is a plan view showing one example of a printed circuit board.

FIG. 13 illustrates an example of a PC board PCB. A lot of parts are mounted on the PC board and soldered thereto. The range of one visual field is indicated by a one-dot and dash line. A range indicated by "IA1" is a first inspection area, and a range indicated by "IA2" is a second inspection area. If an image is enlarged by the zoom lens system 81, an inspection area is narrowed, as an eighth inspection area indicated by "IA8". Such an inspection area is designated by an inspector (a worker). The inspection areas are consecutively numbered starting with 1 so that they are distinguished.

When the XY table is positioned at its initial position, the visual field of the imaging device 80 is the first inspection area IA1. An example of an image displayed on the screen of the display device 13 at this time is illustrated in FIG. 14. The contour of the entire PC board PCB and the position of the first inspection area IA1 in the contour are displayed at the lower right portion of the screen. This is a layout display LD.

The inspector views such a display screen to designate a portion whose soldering is to be inspected (a designated point) (step 203). The point to be inspected can be designated using various marks. For example, a part to be inspected can be designated with a circular mark, as indicated by a circle mark MC. Alternatively, a zone to be inspected can be designated, put in a frame, as indicated by a frame mark MF. The circle mark MC or the frame mark MF need not necessarily correspond to one part. It is possible to indicate a plurality of parts by one mark. Alternatively, it is also possible to divide one part into a plurality of zones and indicate the zones by a plurality of marks.

The circle mark MC or the frame mark MF is produced by the display control circuit 104 in response to a command from the teaching keyboard 112 or the mouse 111, and is displayed on the display screen with a particular color superimposed thereon. The size of the circle of the circle mark MC and the size of the frame of the frame mark MF are variable by the command from the mouse 111.

The inspector successively designates points to be inspected using the mark MC or MF while seeing an image of a part displayed on the display screen. The designated points are assigned designation numbers (serial numbers) in the order designated.

When the inspector designates all points on the display screen (one inspection area) and provide entry indicating that the designation has been completed, the designated points are stored in the teaching table (step 204).

Referring to FIG. 12, the teaching table includes the entered board name and board size stored therein, and includes for each inspection area number the coordinates representing the position of an inspection area corresponding thereto and data relating to points designated in the inspection area. The coordinates of the inspection area are the coordinates of a particular point of the inspection area, for example, a point at the lower left corner. The data relating to the designated point comprises a designation number and the position of a designated point corresponding thereto (coordinate data). Data representing the position of the designated point is constituted by a code representing the type of mark (MC or MF), the diameter and the coordinates (the X and Y coordinates) of the center of the mark in the case of the circle mark MC, or the length and breadth of the mark and the coordinates of the center of the mark in the case of the frame mark MF. If the coordinates of the inspection area and the zoom magnification are found, the coordinates in the XY table of an arbitrary point on the screen are uniquely determined. The controller 100 calculates the coordinates of the center, the diameter or the length of the side of the designated mark on the basis of the position on the screen of the mark.

In the displayed image shown in FIG. 14, an electrode (a lead) E of a part, a land L on the PC board, and soldered areas R, G and B indicated in colors are indicated only with respect to one part. This is also substantially the same in the other drawings of the display screen.

When the designation of all points is completed with respect to one inspection area, the inspector enters a command to move the XY table from the teaching keyboard 112, to position the succeeding inspection area (steps 206 and 207). The succeeding inspection area may be partially overlapped with or spaced apart from the preceding inspection area. The inspector may determine the succeeding inspection area on his or her judgment.

Figure 15A:
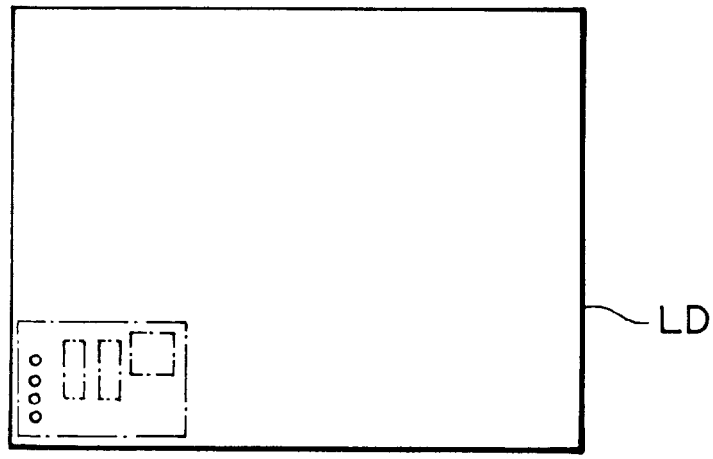
FIGS. 15a and 15b illustrate examples of a layout display.
Figure 15B:
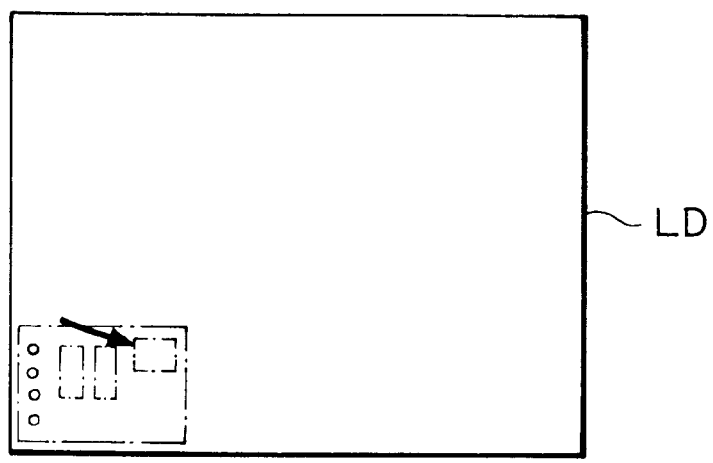

A layout display image representing the succeeding inspection area appears in the layout display LD. The layout display LD may be expressed by an inspection area and designated marks, as shown in FIG. 15*a*, a mark finally designated may be indicated by an arrow as shown in FIG. 15*b*, or the current inspection area may be indicated by an arrow. When the designation of points has already been completed with respect to a plurality of inspection areas, all the inspection areas and the points which have been designated are displayed in the layout display LD. Consequently, the inspector can know to what extent the inspection areas and the points are designated. Particularly if the inspection area which has already been designated and the inspection area which is being currently designated are displayed in different forms (in different colors, for example), they are easier to understand. The inspector successively designates portions to be inspected (inspection areas and points) on the PC board without omission.

The processing in the steps 203 and 204 is also repeated with respect to the succeeding inspection area. The same processing is repeated while successively positioning a new inspection area (steps 206 and 207).

When the foregoing operations and processing are terminated with respect to all the areas on the reference PC board set on the board supporting body 50 (step 205), the produced teaching table is saved in the floppy disk FD by the FD drive 113 in response to entry indicating that the operations and processing have been terminated by the inspector (step 208).

In the foregoing description, the zoom magnification is fixed at a constant value. When the zoom magnification is fixed with respect to one PC board, the zoom magnification is stored in the teaching table in conformity with the board name. The zoom magnification will be entered from the keyboard 112.

When a predetermined zoom magnification is set, the zoom magnification need not be keyed. At this time, the zoom magnification is not also stored in the teaching table.

The zoom magnification may be varied for each inspection area. In this case, the size of the inspection area varies depending on the zoom magnification, as described above. The zoom magnification is entered prior to designating a point to be inspected (step 203). The zoom magnification is stored in the teaching table in conformity with an inspection area number. The zoom magnification may be entered for each designated point.

Furthermore, a command to store an image may be entered from the keyboard 112 when a point to be inspected is designated. In this case, an image in the vicinity of a part designated by a mark is extracted, and the extracted image data is stored in an image data area, linking to an inspection area number and a designation number. The image data may be stored in the teaching table. The image data thus extracted, along with the teaching table, is saved in the floppy disk FD as one representing a standard image (or a limit image). When the inspector uses the keyboard 112 to enter the part name in conformity with the designation number, the designation number may be replaced with the entered part name in the teaching table.

(5) Inspecting Processing

As described above, the visual inspection supporting apparatus can be used by the inspector to inspect a PC board (a PC board to be inspected) for acceptability of soldering in the inspection mode, and can be also used by the inspector to immediately correct a soldered portion which is judged to be unacceptable. For convenience, a case where a plurality of PC boards are only inspected and a case where they are corrected will be separately described.

Figure 16:
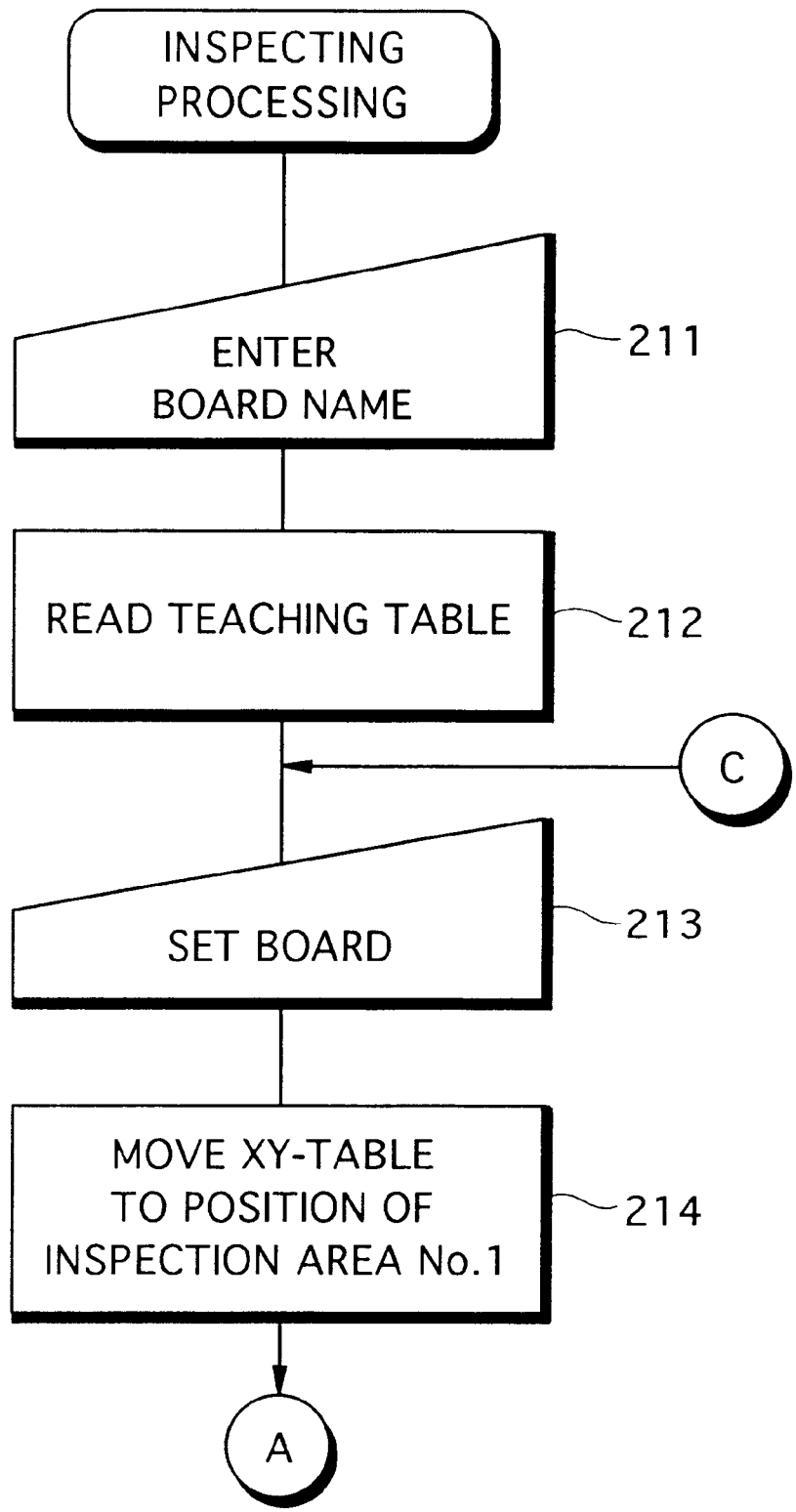
FIGS. 16, 17, 18 and 19 are flow charts showing the procedure for inspecting processing and correcting processing.
Figure 17:
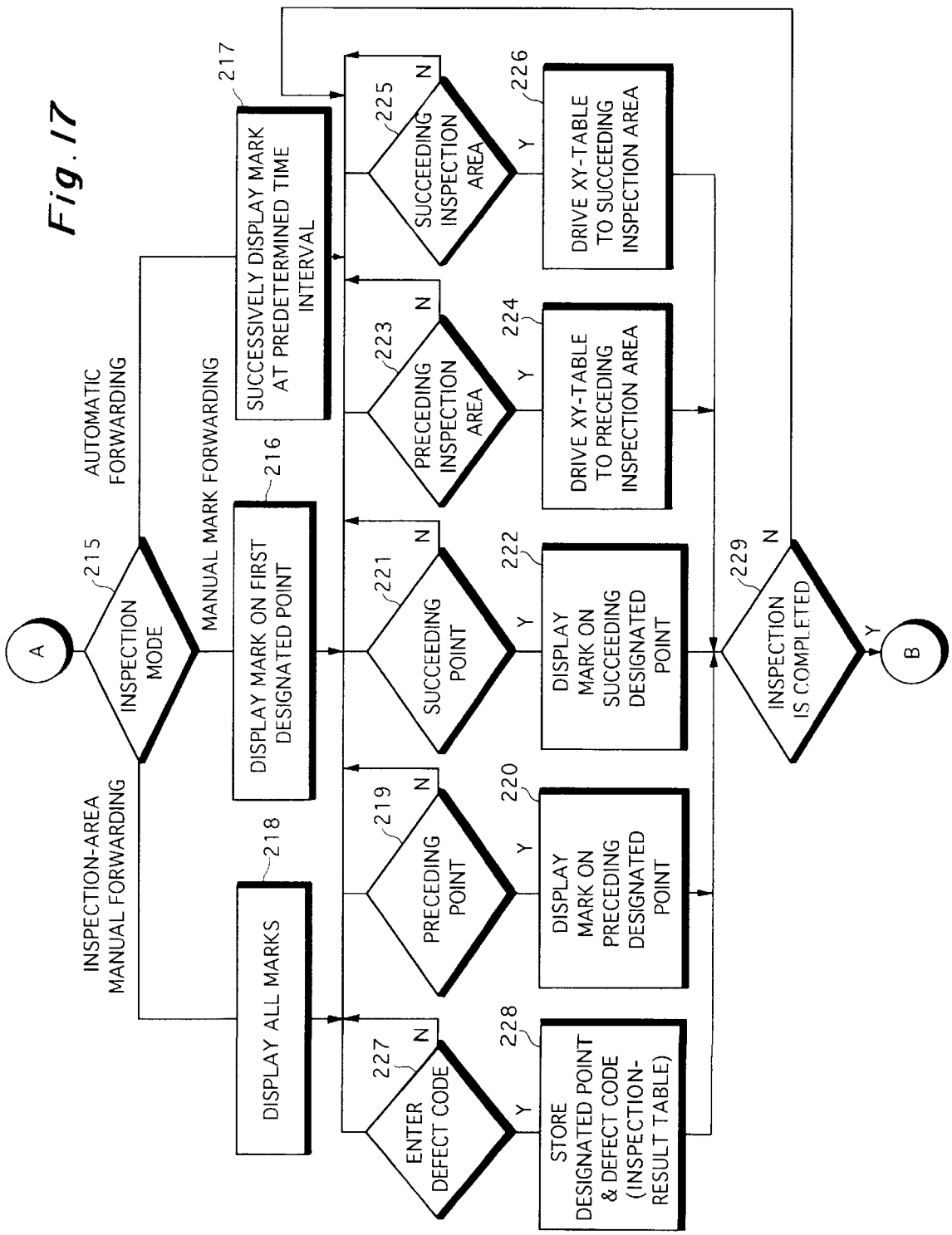
Figure 18:
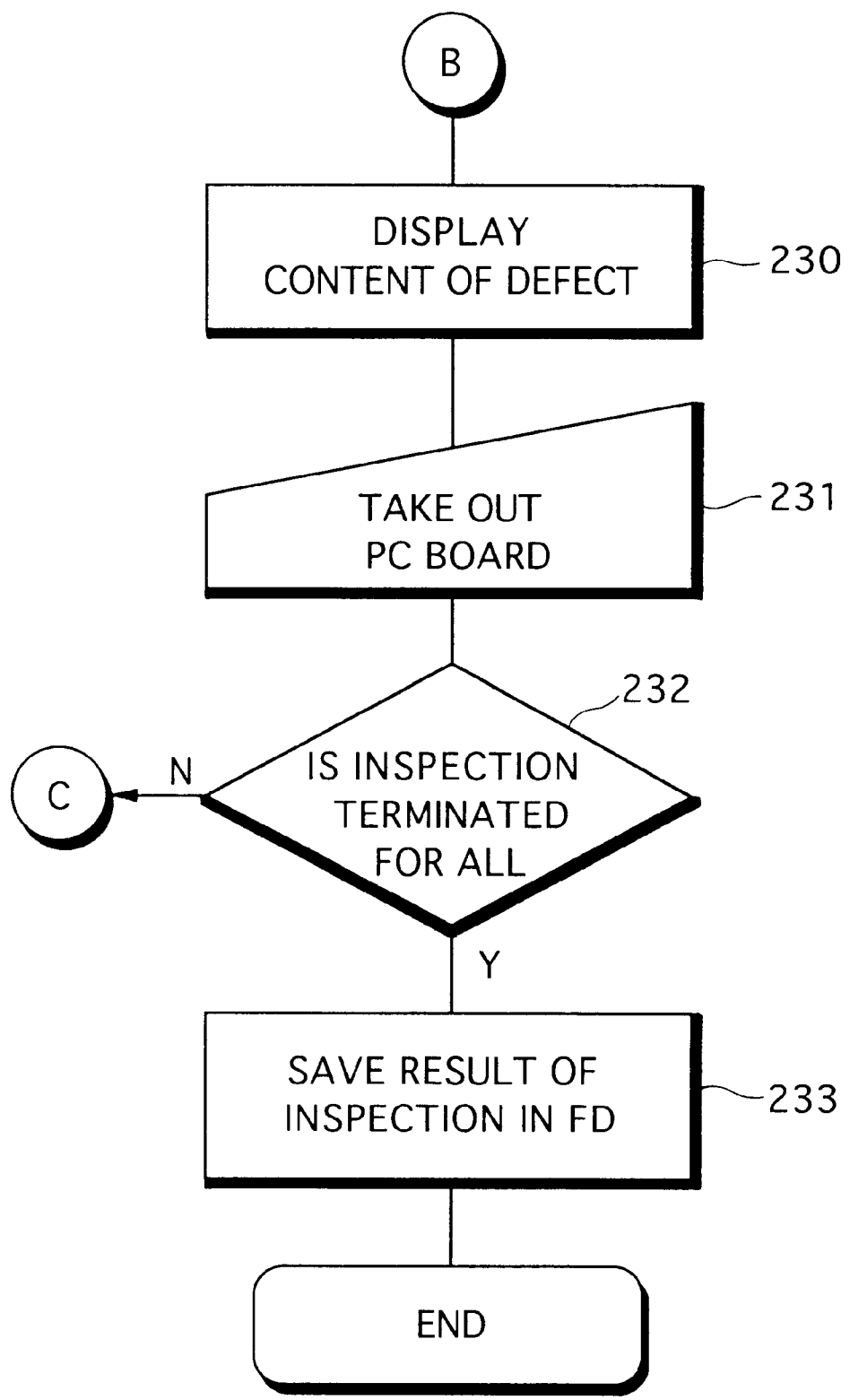

FIGS. 16 to 18 show the procedure for processing in a case where only inspection is made. This processing is also mainly supervised by the controller 100. FIG. 20 shows an example of an inspection-result table.

A plurality of PC boards of the same type are successively inspected. A floppy disk FD storing a teaching table for the PC boards of the type to be inspected is set in the FD drive 113. In addition, the board name (the type of board) of the PC board to be inspected is entered from the teaching keyboard 112 (or the inspecting keyboard 14) (step 211). The plurality of PC boards to be inspected have the same name. In order to distinguish the plurality of PC boards, board numbers are assigned to the PC boards. A number previously assigned to each of the PC boards can be used as the board number. In this case, when the PC board is set (step 213), the board number is entered. The apparatus may automatically assign the board numbers starting with 1 in the order inspected. In this case, the PC boards which have been inspected must be so preserved that the order of inspection can be found (they are numbered or stacked).

In either case, when the board name is entered, the teaching table designated by the board name is read out from the floppy disk FD, and the teaching table is stored in the memory 109 (step 212).

The inspector sets the PC board PCB to be inspected in the board supporting body 50 (step 213). Upon entry indicating that the PC board has been set, the controller 100 refers to the teaching table (particularly, the coordinates of inspection areas) read in the memory 109, to move the XY table to the position where the first inspection area (No. 1) is imaged (step 214). Consequently, an image of the inspection area No. 1 is displayed on the display screen of the display device 13. The inspector judges whether or not soldering on the PC board is acceptable while seeing the displayed image with his or her own eyes. An acceptable soldered portion is not entered, while only a soldered portion which is judged to be unacceptable, along with a code indicating the particulars of its defect (fault), is entered.

Since a soldered portion to be inspected is designated using a mark as described above in teaching processing, and a designation mark is also superimposed on a displayed image of a PC board to be inspected, the inspector may follow a portion to be inspected with his or her eyes with the help of the designation mark. Since data relating to the designation mark is stored in the teaching table, the designation mark is displayed by the display controller 104 on the basis of the data.

A method of displaying a designation mark is mainly divided into three types. The three types are the mark manually forwarding mode, the automatically forwarding mode, and the inspection-area manually fowarding mode. The inspector uses the inspecting keyboard 14 (or the teaching keyboard 112), to select any one of these modes (step 215).

Figure 21A:
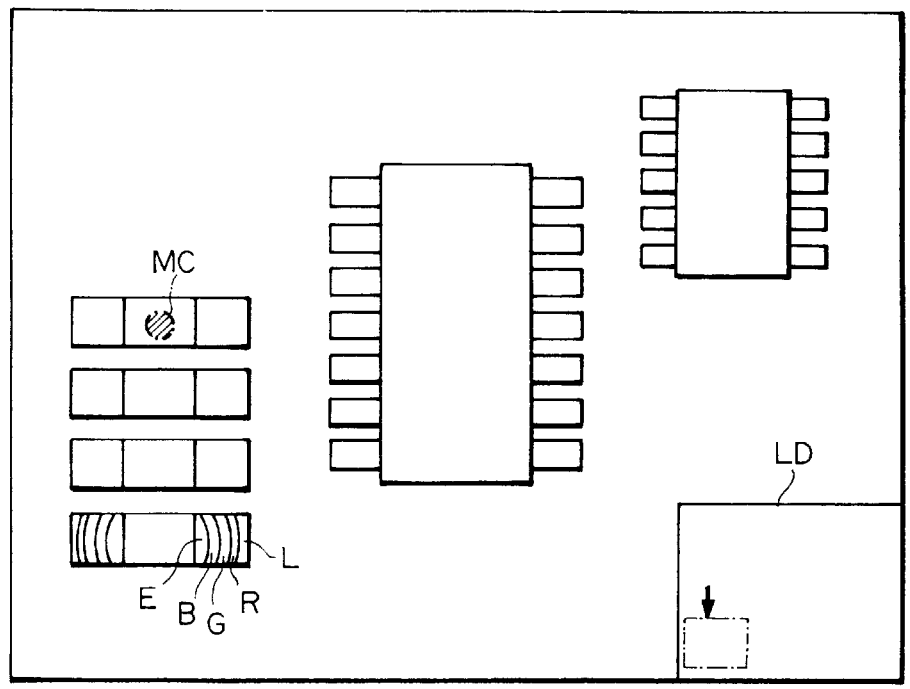
FIGS. 21a and 21b show how a mark representing a designated point is successively driven.
Figure 21B:
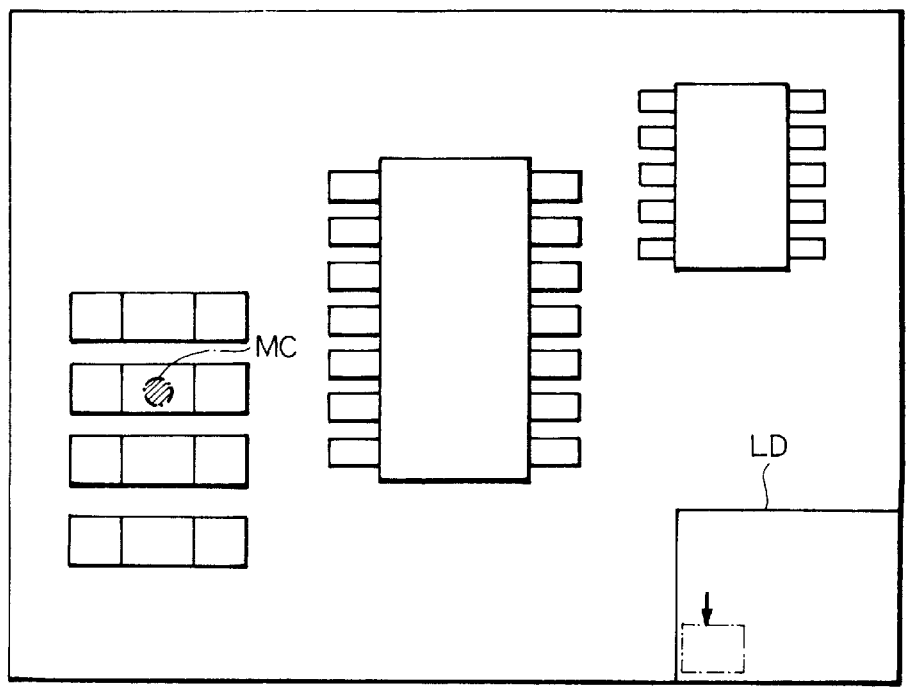

When the mark manually forwarding mode is selected, a circle mark MC of a designation number 1 is first displayed, as shown in FIG. 21a, on an image on a display screen (an image of an inspection area No. 1). The inspector judges whether or not soldering of a part on which the circle mark MC is put (in the case of a frame mark MF, a zone circumscribed by the frame mark MF) is acceptable by seeing the displayed image. If soldering is acceptable, the inspector depresses the succeeding point key on the inspecting keyboard 14 (step 221). Consequently, a mark MC of a designation number 2 is displayed on the display screen, as shown in FIG. 21b (step 222). The inspector successively forwards the mark (the circle mark MC or the frame mark MF) while successively depressing the succeeding point key, to judge whether or not soldering of a portion to be inspected which is indicated by the mark is acceptable. The mark is displayed on the basis of the data relating to the designated point in the teaching table.

When it is desired to look over once again a portion where the mark of the preceding designation number is displayed, the inspector depresses the preceding point key (step 219). Consequently, the mark of the preceding designation number is displayed again (step 220) (return from display shown in FIG. 21b to display shown in FIG. 21a, for example).

Figure 22A:
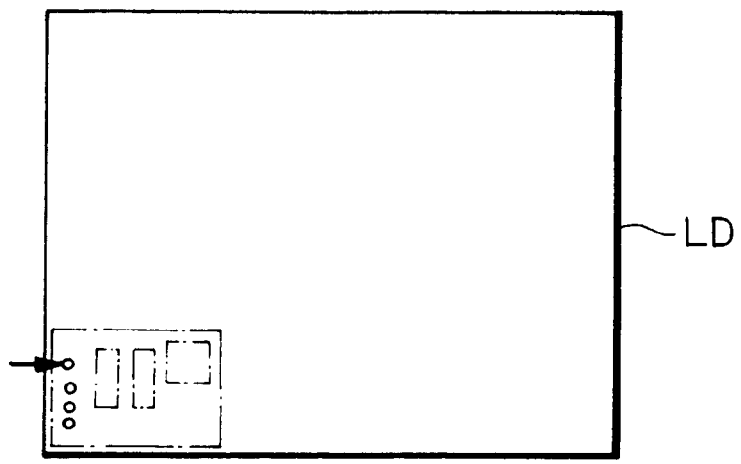
FIGS. 22a and 22b show how a layout display is changed.
Figure 22B:
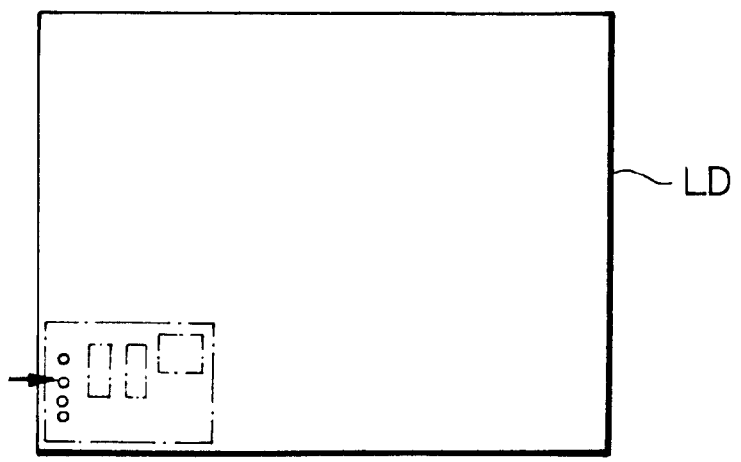

In a layout display LD on the display screen, the position on the PC board of an inspection area currently displayed is indicated by an arrow. Alternatively, a portion on the PC board where a mark is displayed appears on the layout display, as shown in FIGS. 22a and 22b. FIG. 22a and FIG. 22b respectively correspond to FIG. 21a and FIG. 21b.

Upon finding out an unacceptable soldered portion, the inspector depresses a defect code key representing its defect found out on the inspecting keyboard 14 (step 227). Examples of the defect code include "no soldering", "excessive soldering", "a bridge", and "a missing part (no part)". When the defect code is entered, a board number for identifying a PC board undergoing inspection (the board name as required), an inspection area number representing an area being inspected, a designation number representing a portion where a defect is found out, the coordinates of the designation number (a designated point: a code, the diameter or the length and breadth, and the center coordinates), and the defect code are registered in the inspection-result table (step 228) (see FIG. 20).

At this time, an unacceptable portion may be explicitly indicated by changing the color or the shape of a mark (MC, MF) for designating the portion which is judged to be unacceptable. It is preferable that the mark representing the unacceptable portion is not erased until the display of the succeeding inspection area is started. The unacceptable portion may be displayed in the layout display LD. Alternatively, the particulars of the entered defect code may be displayed in characters on the display screen to urge the inspector to confirm the defect code. It is preferable that the defect code which has been entered once can be canceled as required.

When the inspection of the inspection area No. 1 is terminated, the inspector depresses the succeeding inspection area key (step 225), whereby the XY table is so driven that the succeeding inspection area No. 2 can be imaged by referring to data representing the coordinates of inspection areas in the teaching table (step 226). The inspector repeats the above described operations. It is thus possible to perform soldering inspection of all designated points in all inspection areas which are registered in the teaching table.

When the preceding inspection area key on the inspecting keyboard 14 is depressed (step 223), the XY table is so driven that the preceding inspection area is imaged by the imaging device 80 (step 224).

When the automatically forwarding mode is designated, a displayed mark MC or MF successively moves on the screen in order of designation numbers at predetermined time intervals (step 217). The inspector judges whether or not soldering of a portion represented by the mark is acceptable while successively following the displayed mark.

Upon finding out unacceptable soldering, the inspector depresses the defect code key in the same manner as described above, whereby data relating to the unacceptable soldering is registered in the inspection-result table (steps 227 and 228).

If the inspection of one inspection area is terminated, the inspection of the succeeding inspection area is started by depressing the succeeding inspection area key, as described above (steps 225 and 226).

The time interval during which a displayed mark moves may be predetermined. Alternatively, the inspector can also enter the time interval using the keyboard 14 or 112.

It is preferable that a stop key is previously provided in the inspecting keyboard 14 so that a displayed mark is fixed not to move when the stop key is depressed. Consequently, the inspector can carefully inspect a particular portion.

Figure 23:
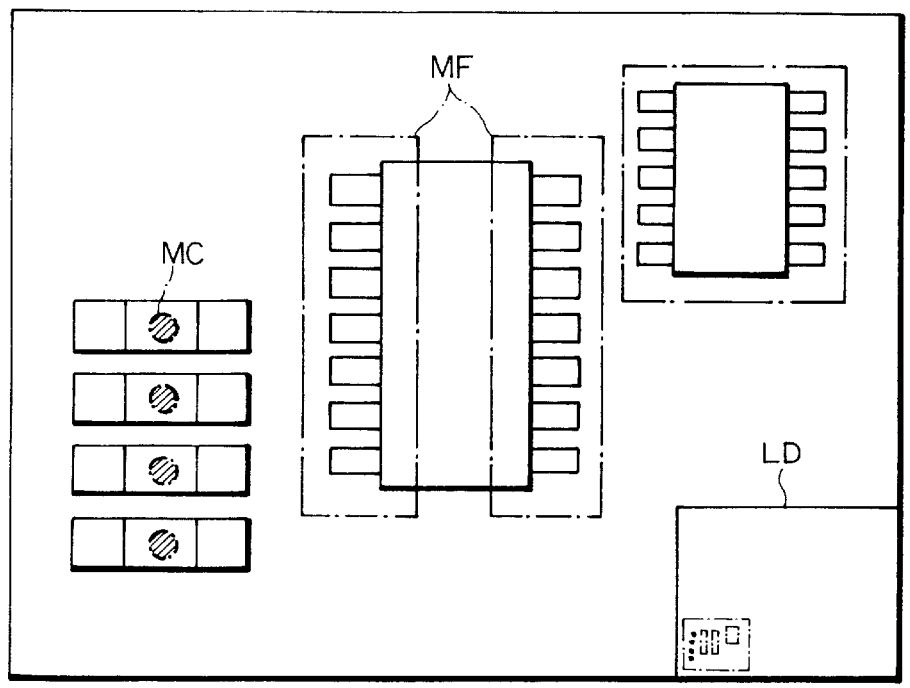
FIG. 23 illustrates an example of an image in which marks representing all designated points in one inspection area are displayed once and for all.

When the inspection-area manually forwarding mode is selected, all marks MC and MF belonging to an area to be inspected are displayed once and for all, as shown in FIG. 23 (step 218). The inspector visually inspects all portions to be inspected while following the marks with his or her eyes.

Upon finding out an unacceptable portion, the inspector points a cursor (displayed on the display screen) at a mark indicating an unacceptable portion, to specify the unacceptable portion and keys a defect code. Alternatively, the color or the shape of the displayed mark may be successively changed every time the inspector depresses the succeeding point key so that the inspector can indicate a defective (faulty) point. In addition, designation numbers may be displayed adjacent to the marks so that the inspector can key-input a designation number of a defective point. In any case, a point which is judged to be defective and a defect code are registered in the inspection-result table.

When inspection of one inspection area is completed, the inspector depresses the succeeding inspection area key on the inspecting keyboard 14 (step 225). Consequently, the imaging device 80 and the Y stage 41 are so moved that the succeeding inspection area can be imaged (step 226). Thereafter, all the marks MC and MF belonging to the set inspection area are displayed once and for all. The inspector can thus perform visual inspection for each inspection area.

Even in any of the inspection modes, when inspection of one PC board is thus completed (inspection of all inspection areas registered in the PC board is completed) (step 229), the results of the inspection stored in the inspection-result table are displayed on the display device 13 (step 230).

Thereafter, the inspector takes out a PC board having been inspected from the board supporting body 50 (step 231), and sets the succeeding PC board to be inspected (step 231), after which soldering inspection is performed in the same manner.

When inspection of all PC boards to be inspected which are previously prepared is completed (step 232), the contents of the inspection-result table are saved in the floppy disk FD.

If required, a statistical operation is executed and the result of the operation is displayed. Specifically, when the inspector enters an operation command from the keyboard 14 or 112, a total or statistical operation effective in analyzing the quality of mounting is executed using data representing the result of inspection of all PC boards which have already been inspected, and the result of the operation is displayed on the display device 13 and is saved in the floppy disk FD. Examples of the total or statistical operation include a rate of defect relating to PC boards (a value obtained by dividing the number of defective PC boards by the number of all PC boards), a rate of defect related to parts (a value obtained by dividing the number of defective parts by the number of all parts), a rate of defect for each type of part, the order of defective items for each type of part, and the order of defective portions starting with the most defective portion and the particulars of the defect. The result of the inspection and the result of the operation are printed out from the printer 114 as required.

Figure 24:
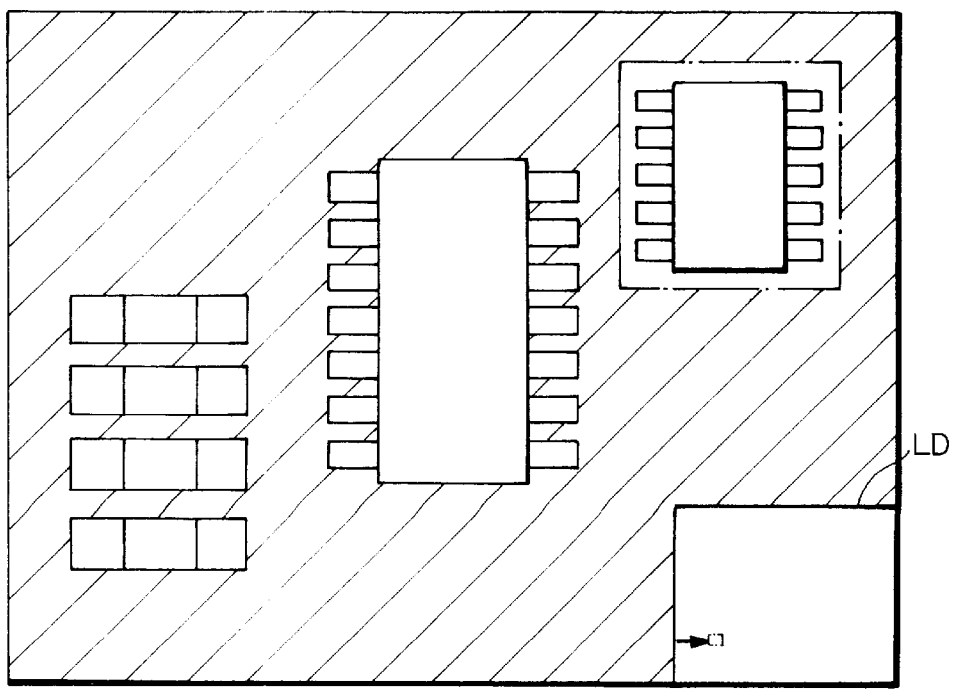
FIG. 24 illustrates another example in which a designated point is indicated.

FIG. 24 illustrates another method of displaying a portion to be inspected (particularly in the mark manually forwarding mode and the automatically forwarding mode). In this method, the brightness in an area of a portion to be inspected (the inside of a frame mark MF) is made different from the brightness of the other areas (for example, the inside of the frame mark MF is made bright) instead of circumscribing the portion to be inspected by the frame mark MF. In a layout display LD, the portion to be inspected is indicated by an arrow. In the inspection-area manually forwarding mode, all areas which are circumscribed by frame marks will be so displayed that the brightness of the areas differs from the brightness of the other areas.

Figure 25:
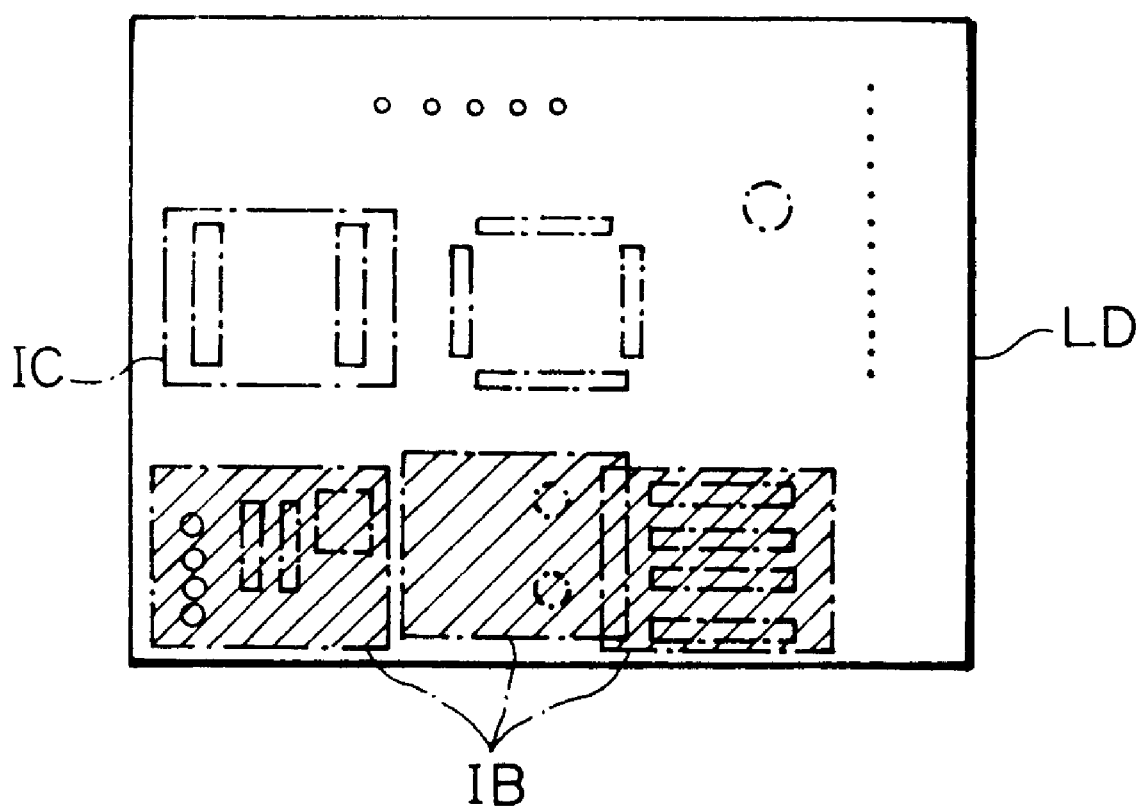
FIG. 25 illustrates another example of a layout display.

FIG. 25 illustrates another example of a layout display LD. In this layout display LD, an area which has already been inspected is displayed in a form different from those in the other area (by changing the brightness and the color of the area which has already been inspected, as indicated by "IB"). An area being currently inspected is also displayed so that it can be found that the area is being currently inspected, as indicated by "IC" (by circumscribing the area by a frame, changing the brightness or the color of the area, for example).

The foregoing description premises that the zoom magnification is fixed. As previously described, when the zoom magnification is stored for each PC board in the teaching table, the zoom magnification is displayed on the display device 13. The inspector sees the display of the zoom magnification to adjust the zoom lens system 81 by hand so that the displayed zoom magnification is realized. When the zoom magnification is stored for each inspection area in the teaching table, the zoom magnification is displayed on the display device 13 every time the inspection area is changed (step 226), whereby the inspector adjusts the zoom lens system 81 by hand so that the displayed zoom magnification is realized.

Figure 26:
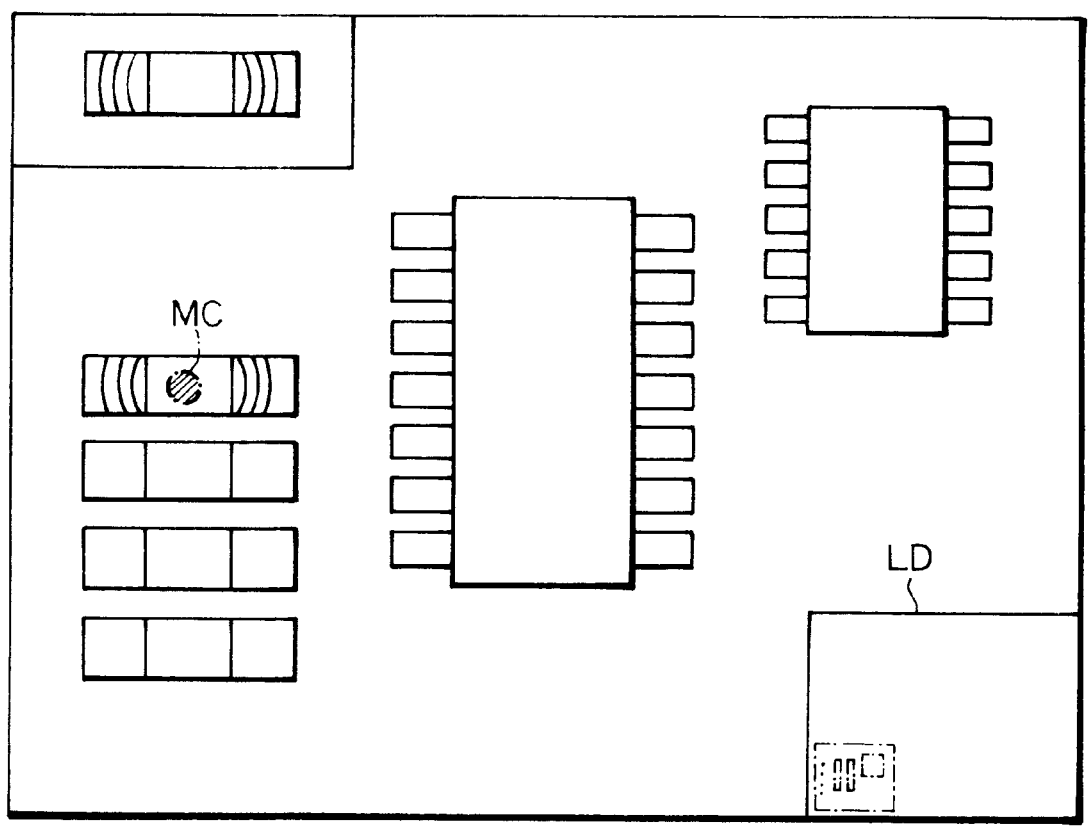
FIG. 26 illustrates an example in which a standard image is displayed.

When standard image data obtained by photographing the reference PC board is saved in the teaching table, linking with a designated point (or part), the standard image (a limit image) of a part designated by a mark MC (or MF) is displayed on a display screen, as shown in FIG. 26 (in FIG. 26, the standard image is displayed at the upper left portion). The inspector can compare the standard image (one in which soldering is acceptable or one in which soldering is just in the boundary between acceptable and unacceptable) with an image designated by the mark to judge whether or not soldering in the image designated by the mark is acceptable.

In a case where the visual inspection supporting apparatus comprises a marking unit, the inspector can enter a marking command upon finding out unacceptable soldering. Since the marking unit is moved to an unacceptable soldered portion on a PC board which is pointed out by the inspector, where ink is dropped on the unacceptable soldered portion, the unacceptable portion is indicated on the actual PC board.

Figure 27:
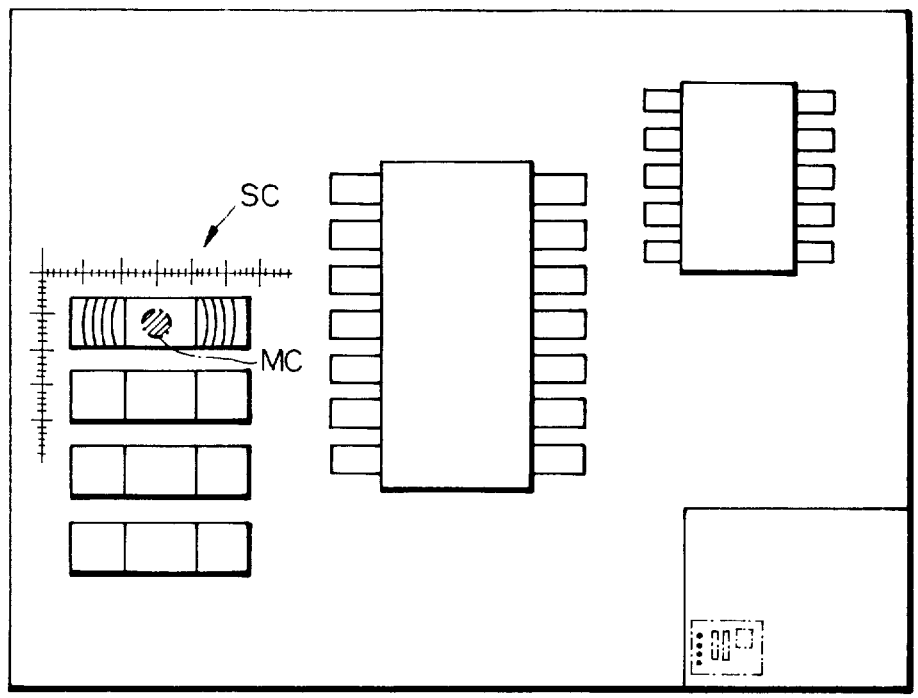
FIG. 27 illustrates an example in which a scale is displayed on an image.

FIG. 27 illustrates another example of a display. In FIG. 27, a scale SC is displayed near a part, a portion or a location being currently inspected which is indicated by a mark MC. The inspector can judge whether or not soldering is acceptable by referring to the scale SC. Particularly, it is judged whether or not soldering at the tip of a lead (an electrode) is acceptable depending on whether or not a fillet (a portion indicated in blue B on a display screen) is correctly formed. It is judged whether or not soldering is acceptable by measuring the length of the fillet using the scale SC (that will be described later with reference to FIGS. 30a and 30b).

If the zoom magnification is determined, the length on the display screen can be converted, whereby the scale SC is displayed on the basis of the zoom magnification. When the zoom magnification is fixed, the fixed zoom magnification is used. When the zoom magnification is entered, the entered zoom magnification is used. When the zoom magnification is detected as described later (see FIG. 35), the detected zoom magnification is used. This is also the same in the other examples of a display as described later.

The personal difference between inspectors is made up by thus displaying the scale, whereby it is possible to objectively and accurately make judgment and make the quality of inspection constant. In addition, the operating efficiency is improved.

Figure 28:
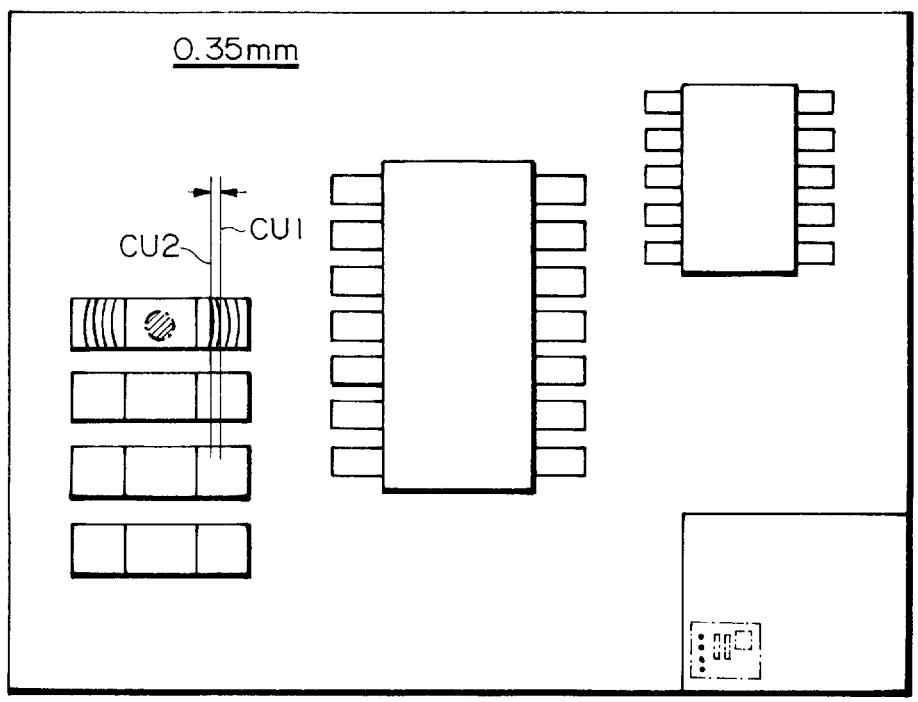
FIG. 28 illustrates an example in which two lines are displayed on an image.

In FIG. 28, two cursors CU1 and CU2 are displayed on a display screen so that the cursors can be moved using the mouse 111. The inspector aligns the cursors CU1 and CU2 with both ends of a fillet (one end is normally the tip of a lead). The distance between the two cursors is calculated using the zoom magnification and is displayed. The labor of the inspector can be further reduced, and the operating efficiency is improved.

FIG. 29 illustrates still another example of a display, in which a portion of a display screen is illustrated in enlarged form. The distance between two cursors is displayed as a measured value, and a standard value or a boundary value (the criterion in inspection) is also displayed. The objective judgment is further ensured.

FIG. 30a illustrates a cross section of a part PA, a lead (an electrode) E, solder SO, a land L, and a PC board PCB, and FIG. 30b illustrates a photographed image thereof. A portion having a steep slope in the solder SO is indicated in blue B, and a portion having a gentle slope is indicated in green G (see the construction of the above described light projecting device 70 or 90). The portion indicated in blue B is referred to as a fillet.

Figure 31:
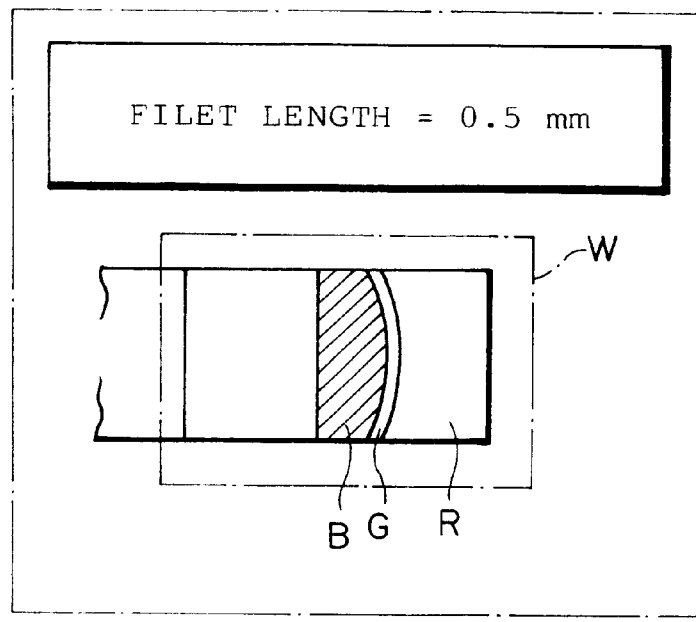
FIG. 31 illustrates an example of a display in a case where the fillet length is automatically measured.
Figure 32:
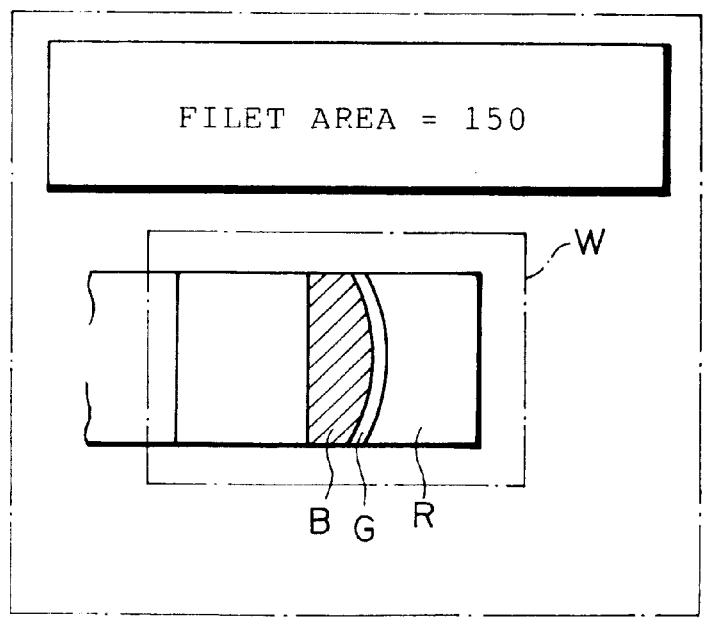
FIG. 32 illustrates an example of a display in a case where the fillet area is automatically measured.

FIGS. 31 and 32 illustrate still another example of a display, in which the fillet length and the fillet area are automatically measured, respectively. In the teaching mode, a window W is set to a portion to be inspected by the inspector. The position and the size of the window W will be determined using the mouse 111 by the inspector. A color signal B representing a blue color out of signals representing the three primary colors which are obtained from the imaging device 80 is used. In the set window W, the maximum value of the length in the horizontal direction (the number of pixels) in which the color signal B has a value of not less than a predetermined threshold value represents the fillet length. In the window W, the number of pixels in which the color signal B has a value of not less than a predetermined threshold value represents the fillet area. The fillet area will be represented utilizing the number of pixels, square millimeter or the like as a unit.

The fillet length and the fillet area are thus automatically found and are displayed, thereby improving the operating efficiency.

Similarly, the area and the length of a flat portion (a portion in red R) and the portion having a gentle slope (the portion in green G) are also automatically founds The soldered state can be represented by a numerical value by calculating the ratio of the portion in blue B to the portion in red R (the length ratio and the area ratio) and the ratio of the portion in green G to the portion in red R.

As illustrated in FIGS. 33a and 33b, the area and the length of the portion in red R are significantly larger than those of the portions in the other colors in a case where the solder SO is small in amount and is almost perpendicularly attached. As illustrated in FIGS. 34a and 34b, the area and the length of the portion in green G are increased in a case where the solder SO is small in amount and is almost horizontally attached. The soldered state can be found depending on which of portions in the colors is the largest.

Figure 19:
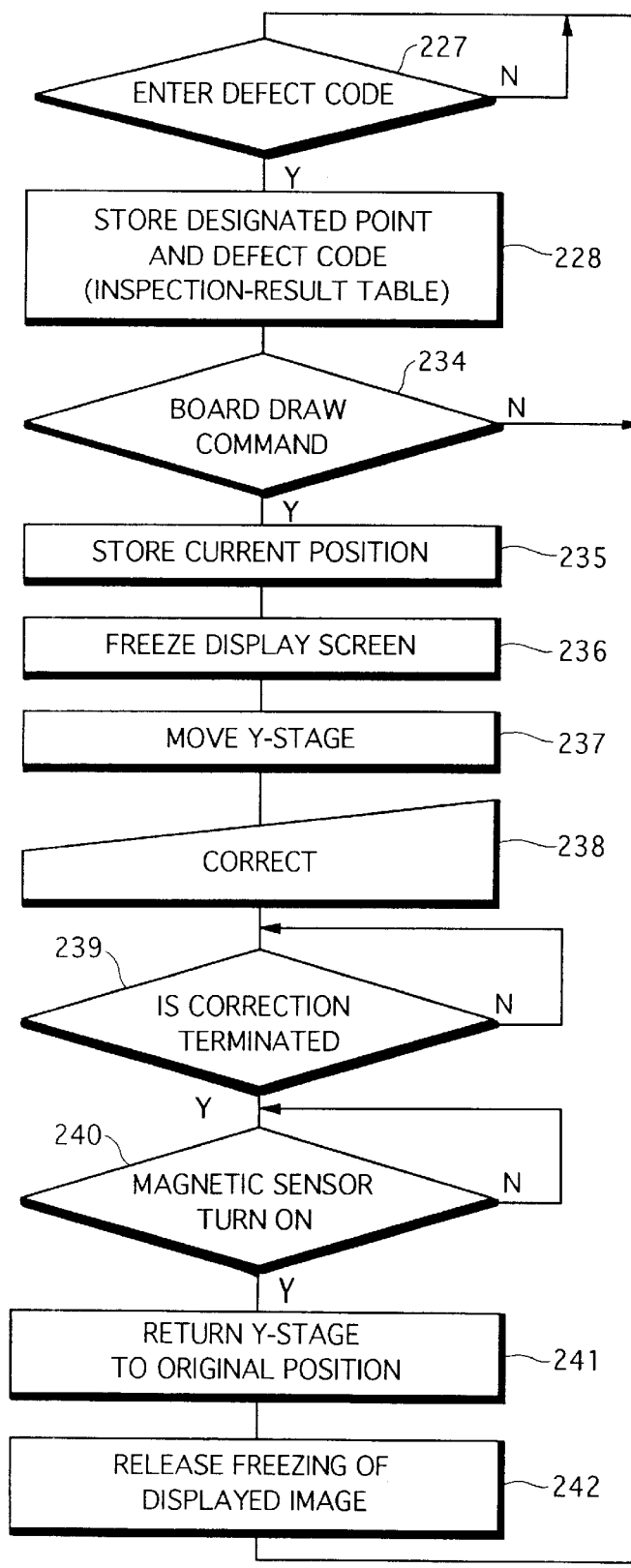

Description is finally made of operations and processing for the inspector to correct unacceptable soldering in the process of inspection with reference to FIG. 19.

Upon finding out unacceptable soldering, the inspector enters its defective point and a defect code representing its defect as described above, whereby data representing the defect are stored in the inspection-result table (steps 227 and 228).

The inspector then draws out the PC board, along with the Y stage 41, toward himself or herself to manually correct an unacceptable portion by hand. When the inspector enters a board draw command from the keyboard 14 (or 112) (step 234), the positions of the X stage 21 and the Y stage 41 (the coordinates of the center of the visual field) at that time are stored as return positions in the memory 109, and the display screen is frozen (steps 235 and 236). Specifically, an image of an inspection area at that time is displayed as a still image by repeatedly reading out the same image data from the frame memory 102.

The Y stage 41 is fed forward (nearer to the inspector) to the leading end of the rail 33 along the Y-axis rail 33 (step 237). The inspector obliquely raises the board supporting body 50 with the handle 60 in his or her hand. Consequently, the PC board PCB disposed on the board supporting body 50 is inclined. In this state, the inspector searches for an unacceptable soldered portion on the PC board while referring to the layout display LD on the display screen and the frozen image, to correct unacceptable soldering using a soldering iron (step 288).

When the correction of unacceptable soldering is completed, the inspector returns the board supporting body 50 to its horizontal position and provide entry indicating that unacceptable soldering has been corrected from the keyboard 14 (step 239). After it is confirmed that the magnetic sensor 47 detects the permanent magnet 46 (step 240), the Y stage 41 is returned to the stored return position (step 241). The freezing of the displayed image is released (step 242). The fact that unacceptable soldering has been corrected is stored in the inspection-result table in conformity with its defective point.

Every time the inspector finds out an unacceptable portion while inspecting soldering of a PC board PCB, the inspector can correct the unacceptable portion in a state where the PC board PCB is drawn out toward himself or herself and is obliquely raised. Moreover, the image of the inspection area continues to be frozen and displayed even after the PC board PCB is drawn out, whereby the inspector can easily find out the unacceptable portion on the PC board.

The inspector may mark the unacceptable portion instead of correcting unacceptable soldering.

It goes without saying that correcting work in the step 234 and the subsequent steps can be performed after inspection of one inspection area is completed or inspection of one PC board is completed.

It goes without saying that soldering correction can be made in the above described manner by setting only a PC board having an unacceptable portion on the board supporting body 50 after the inspection of all PC boards is completed.

(6) Electrical Construction of Visual Inspection Supporting Apparatus (Part 2)

Figure 35:
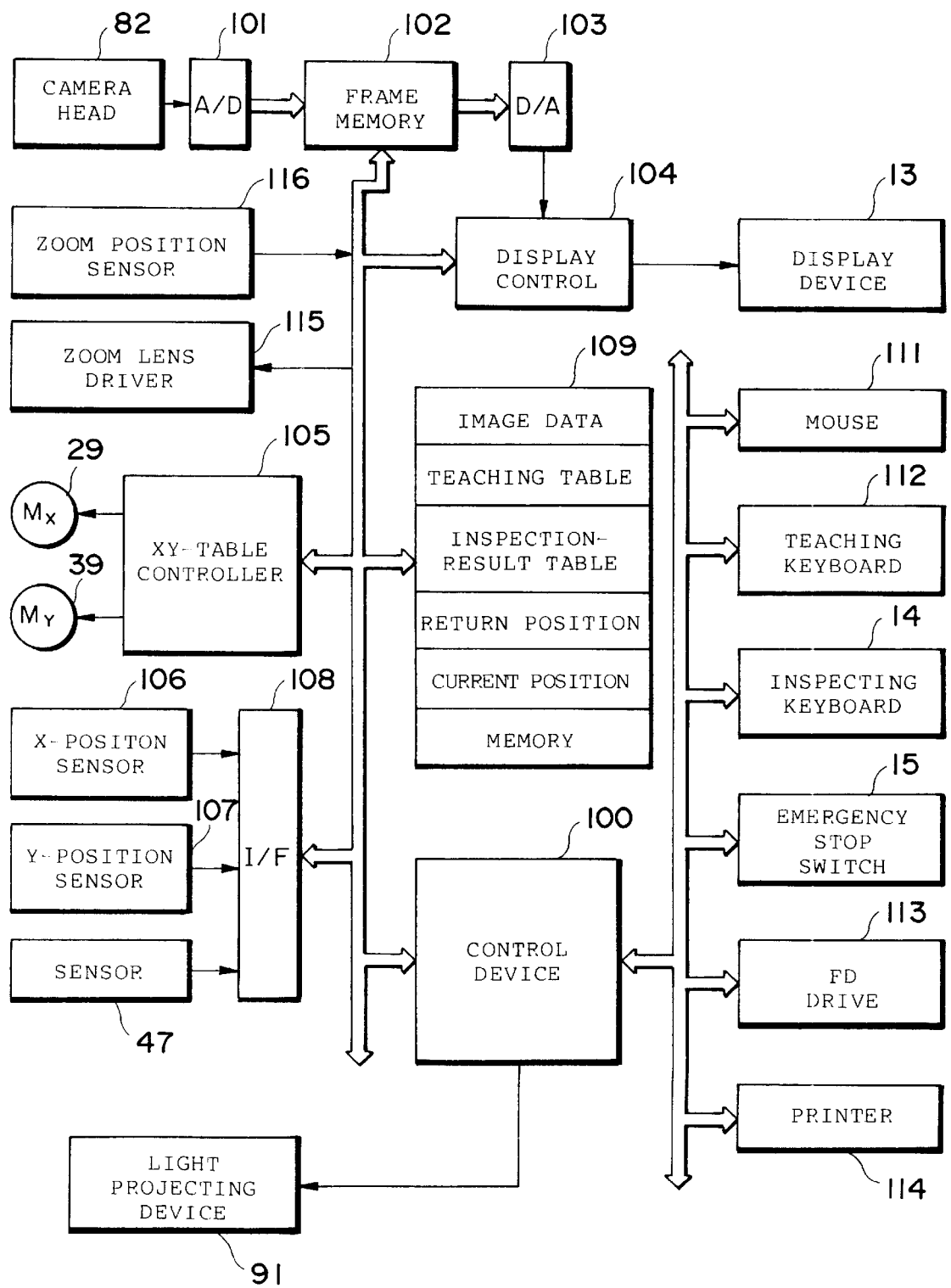
FIG. 35 is a block diagram showing the electrical construction of the visual inspection supporting apparatus (Part 2)

FIG. 35 illustrates another example of the electrical construction of the visual inspection supporting apparatus. The same blocks as those shown in FIG. 10 are assigned the same reference numerals and hence, the description thereof is not repeated.

There are provided a zoom lens driver 115 for moving a zoom lens of the zoom lens system 81 in accordance with a command from a controller 100 and a zoom position sensor 116 for sensing the position of the zoom lens. A zoom position signal of the sensor 116 is fed to the controller 100. A position command value given to the zoom lens driver 115 can be also used as zoom lens position data without providing the sensor 116. In either case, the zoom magnification is determined by the position of the zoom lens. Further, the light source equipment 91 shown in FIG. 9 is connected to the controller 100 in place of the light projecting device 70.

By using the visual inspection supporting apparatus of this construction, the zoom magnification can be determined for each type of board or for each inspection area by entering a zoom command from a keyboard 112 in teaching processing. The zoom magnification is stored in a teaching table. The zoom magnification may be designated for each part (designated point). In this case, the zoom magnification is stored for each designation number in the teaching table.

In the inspection mode, the zoom lens is automatically driven by the zoom lens driver 115 for each type of board, for each inspection area, or for each part (point) in accordance with the zoom magnification stored in the teaching table, and the designated zoom magnification is realized. The zoom magnification may also be used for displaying the scale, calculating the length and calculating the area shown in FIGS. 27 to 32.

(7) Mechanical Construction of Visual Inspection Supporting Apparatus (Part 2)

FIGS. 36 to 40 illustrate another example of the mechanical construction of the visual inspection supporting apparatus.

Figure 36:
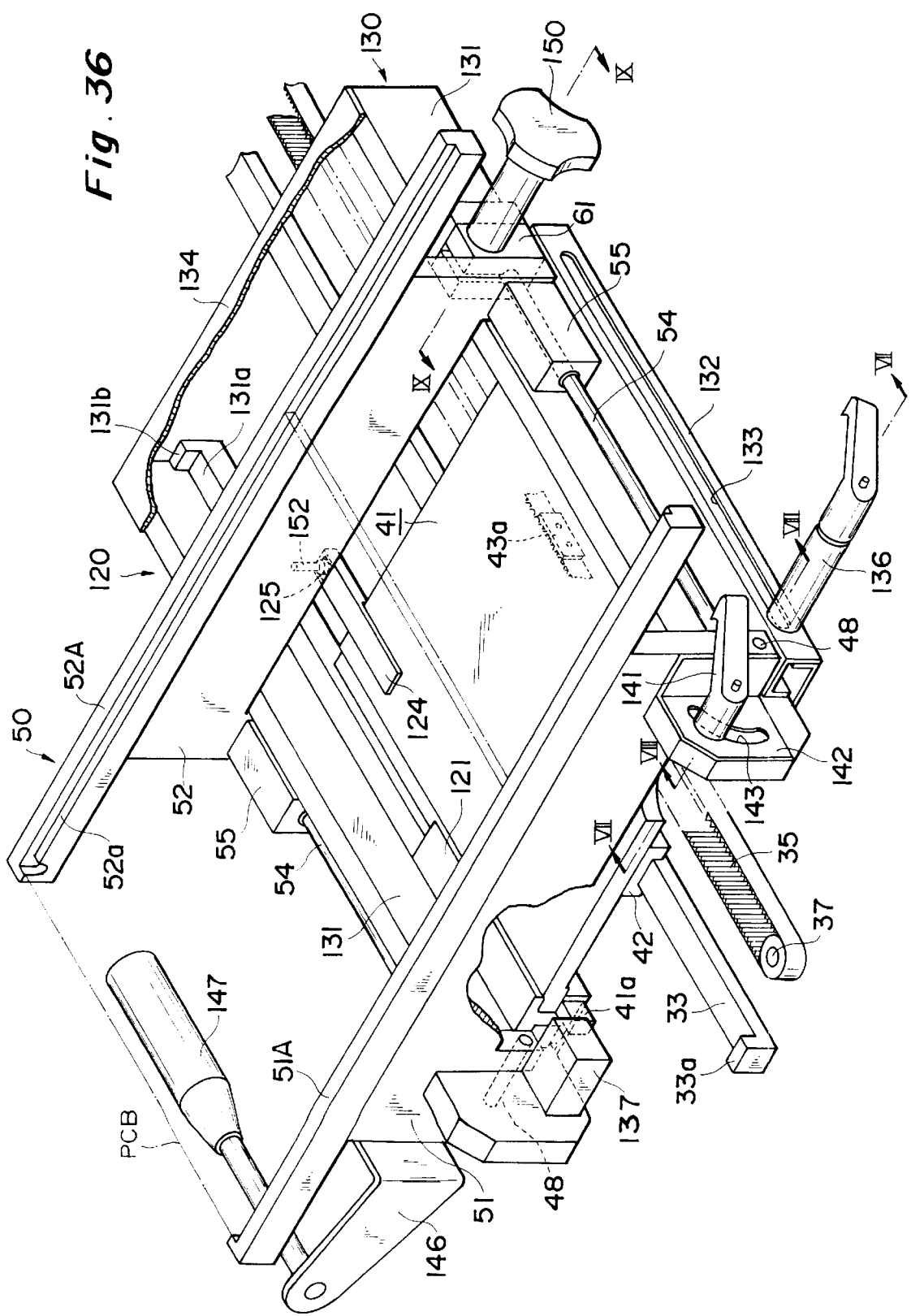
FIGS. 36 to 40 illustrate an example of the mechanical construction of the visual inspection supporting apparatus (Part 2)
Figure 37:
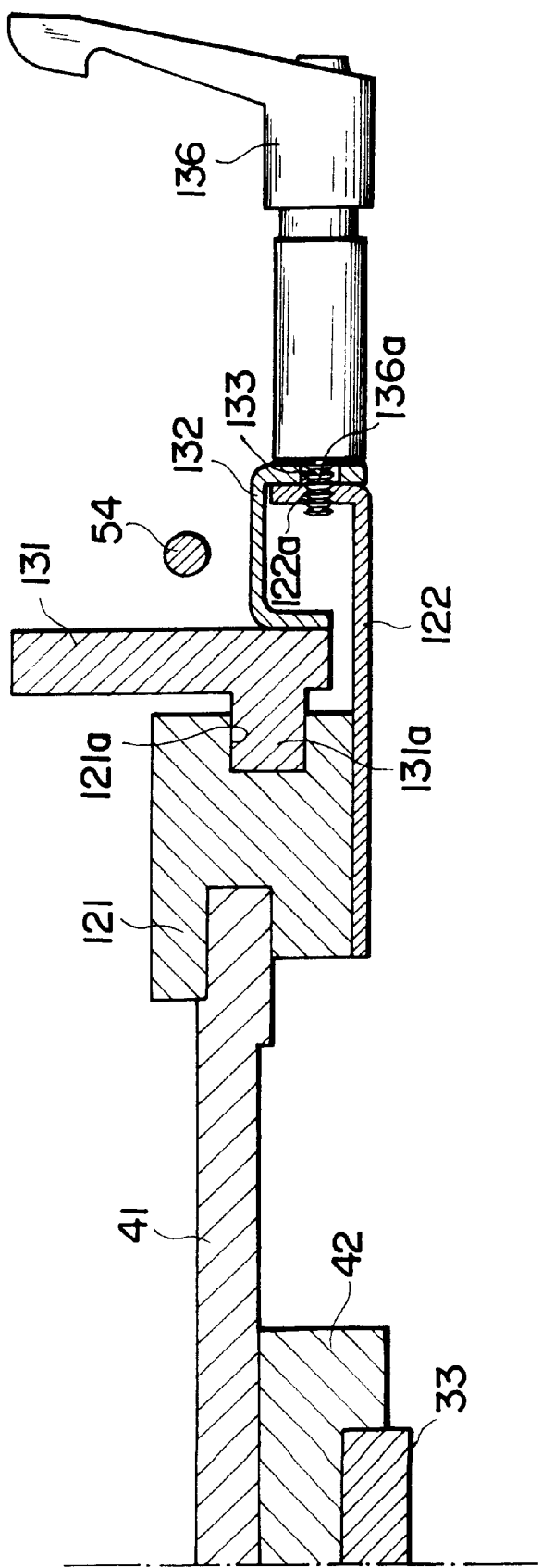

A base 10, a table 11, an X-axis table 20, a light projecting device 70, and an imaging device 80 are the same as those shown in FIG. 1 and hence, the illustration thereof is omitted. FIG. 36 corresponds to FIG. 2, which illustrates a Y-axis table 120. In FIGS. 36 to 40, the same members, elements or portions as those shown in FIGS. 1 to 4 (including those not only having the same shape but also performing the same or similar function) are assigned the same reference numerals to avoid overlapping of description as much as possible.

The construction of a Y stage 41 is basically the same as the above described one. A guide member 121 is fixed to the front half of the Y stage 41 (a supporting plate 43) on both sides thereof, and a guide groove 121a is horizontally formed along the longitudinal direction of the guide member 121 on an outer side surface thereof (particularly see FIG. 37). A guide and lock plate 122 is fixed to the lower surface of the guide member 121. The guide and lock plate 122 extends outward and is raised upward at its outer end. A screw hole 122a is formed at the front portion of a raised portion. An attaching piece 124 is fixed to the rear end of the Y stage 41. The attaching piece 124 is provided with a magnetic sensor 125. The front end of a Y-axis rail 33 is raised to serve as stopper 33a.

The peculiar construction in the present embodiment is that a sliding member 130 is provided. The sliding member 130 has sliding walls 131 provided on both sides thereof. A rail 131a extending in the longitudinal direction is formed inside of the sliding walls 131. The rail 131a is slidably fitted in the guide groove 121a of the guide member 121. Consequently, the sliding member 130 is slidable back and forth with respect to the Y stage 41.

The right and left sliding walls 131 are fixedly coupled to each other by a front plate 51 of the board supporting member 50 and a cover 134 fixedly laid over the sliding walls 131.

An auxiliary plate 132 extending in the longitudinal direction is fixedly attached to the sliding wall 131 outside thereof. The auxiliary plate 132 extends outward and is curved downward. A downwardly curved portion of the auxiliary plate 132 is formed with a long hole 133 extending in the longitudinal direction. A fixing lever 136 has a screw 136a fixed thereto and axially projected (particularly see FIG. 37). The screw 136a is screwed in the screw hole 122a of the guide and lock plate 122 through the long hole 133.

If the screw 136a fitted in the female screw 122a is loosened by means of the lever 136, the sliding member 130 moves back and forth with respect to the Y stage 41. When the screw 136a is tightly fitted in the female screw 122a by means of the lever 136, the lock plate 122 and the auxiliary plate 132 are tightly fastened, and the sliding member 130 is fixed to the Y stage 41 so that the sliding member 130 is moved along with the Y stage 41.

The rail 131a inside of the sliding walls 131 is formed with a raised stopper 131b at the rear end thereof. The stopper 131b abuts against the rear end of the guide member 121 of the Y stage 41, to determine the limit of forward draw of the sliding member 130 (see FIG. 40). A stopper 137 is secured on the front portion of the sliding walls 131 inside thereof to project inward. When the sliding member 130 retreats, the stopper 137 abuts against a projection 41a provided on the front end surface of the stage 41. Consequently, the retreat position of the sliding member 130 is determined. In the normal state (at the time of inspecting a PC board), the sliding member 130 is in this retreat position.

The present embodiment is the same as the above described embodiment in that the board supporting body 50 comprises a front plate 51 and a rear plate 53 which are linked by rods 54, and a movable plate 52 which is movable along the rods 54.

The board supporting body 50 is not mounted on the Y stage 41 but is mounted on the sliding member 130 so as to be capable of being raised and lowered. That is, the front plate 51 of the board supporting body 50 is pivoted at both lower portion thereof to the front portions of the sliding walls 131 of the sliding member 130 by shafts 48.

Figure 38:
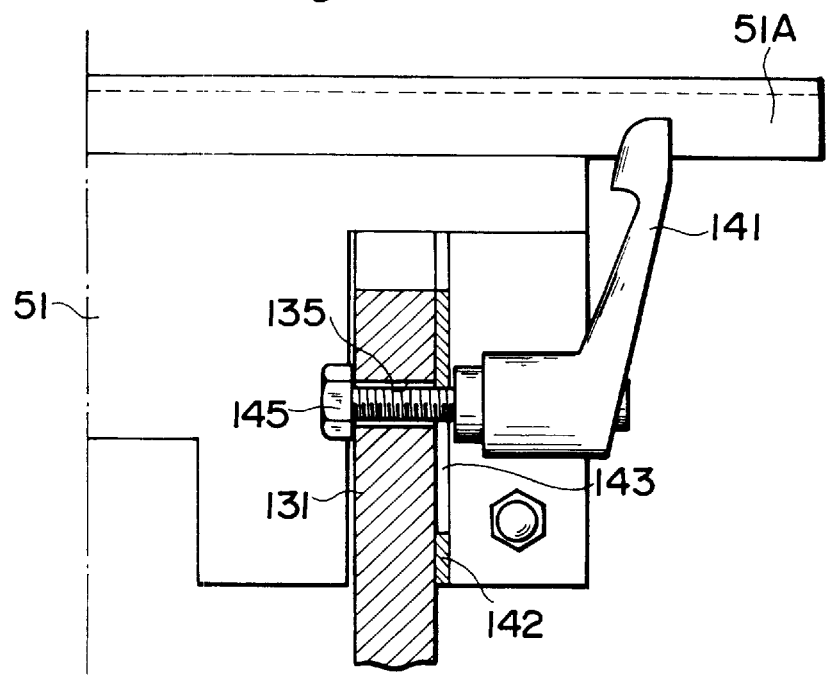
Figure 39:
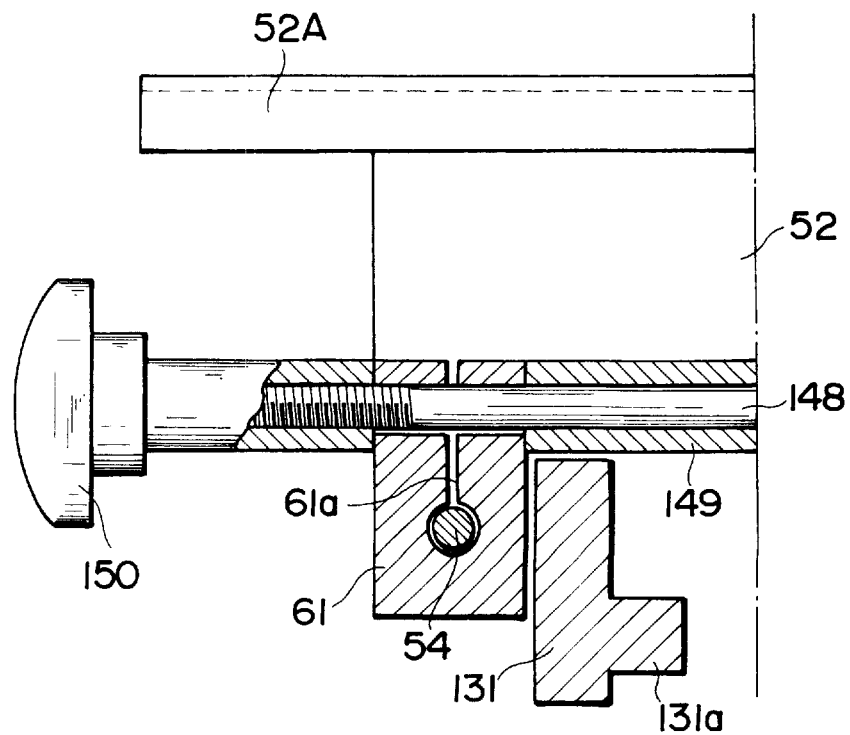
Figure 40:
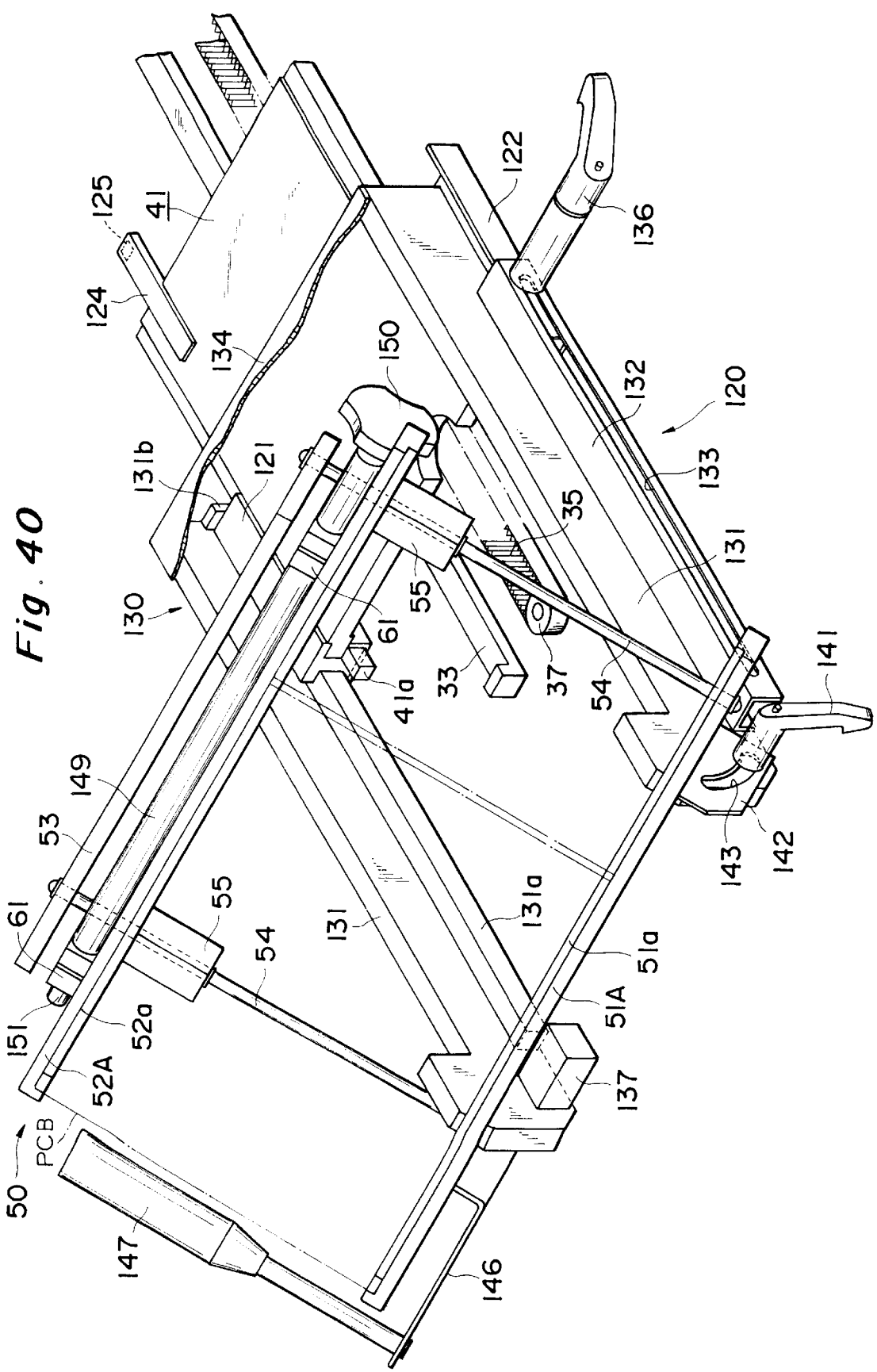

One of the sliding walls 131 of the sliding member 130 is formed with a hole 135 is provided at the front portion thereof (particularly see FIG. 38). A bolt 145 passes through the hole 135. On the other hand, a bracket 142 bent at right angles is secured to a portion, which corresponds to the hole 135, of the board supporting body 50, and a arc-shaped long hole 143 is formed on a forwardly projected portion of the bracket 142. The bolt 145 is screwed into a lever 141 through the arc-shaped long hole 143. In a state where the board supporting body 50 is in its horizontal position or is obliquely raised at an arbitrary angle, therefore, if the lever 141 is turned to fasten the bolt 145 to a female screw of the lever 141, the board supporting body 50 is fixed to its horizontal position or its obliquely raised position. In order to make it easy to perform an operation for raising and lowering the board supporting body 50, a handle 147 is attached to the front plate 51 via a bracket 146.

Two split pieces 61 through which the two rods 54 are respectively inserted are fixedly attached to the rear surface of the movable plate 52. The split pieces 61 are respectively formed with holes so as to horizontally intersect slits 61a of the split pieces 61, and a clamp screw bar 148 passes through the holes (particularly see FIG. 39). The screw bar 148 passes through a spacing holding pipe 149 between the two split pieces 61. A clamp 150 and a cap 151 each having a female screw formed therein are respectively screwed to both ends, which are extended outward from the split pieces 61, of the screw bar 148. Consequently, the two split pieces 61 respectively fasten the rods 54 by turning the clamp 150.

A permanent magnet 152 is attached to a location, which corresponds to the magnetic sensor 125, of the rear plate 53. The permanent magnet 152 is detected by the sensor 125 only in a case where the sliding member 130 is in its retreat position and the board supporting body 50 is in its horizontal position.

The Y-axis table of such construction is used similarly to that in the above described embodiment in the teaching mode and the inspection mode. At this time, the sliding member 130 is held in the retreat position and the board supporting body 50 is held in the horizontal position.

A method of using the Y-axis table differs from that in the above described embodiment only when an unacceptable soldered portion on the PC board is corrected. It is assumed that a predetermined inspection area on a PC board PCB is imaged by the imaging device 80, and an image obtained by the imaging is displayed on a display device 13. When the unacceptable soldered portion on the PC board is corrected in this state, the inspector loosens the lever 136 to draw out the sliding member 130 forward while holding the Y stage 41 in its position. Unacceptable soldering is corrected in a state where the board supporting body 50 is obliquely raised (see FIG. 40).

After the correcting work of unacceptable soldering, the inspector returns the board supporting body 50 to the horizontal position and returns the sliding member 130 to the original retreat position. Since this state is sensed by the sensor 125, the driving of the Y stage 41 by a motor 39 is allowed.

It goes without saying that when the sliding member 130 is drawn out forward, an image so far picked up is displayed as a still image on the display device 13 in response to a correction start entry by the inspector or the fact that there is no sensing signal from the sensor 125 (image freezing).

(8) Mechanical Construction of Visual Inspection Supporting Apparatus (Part 3)

Figure 41:
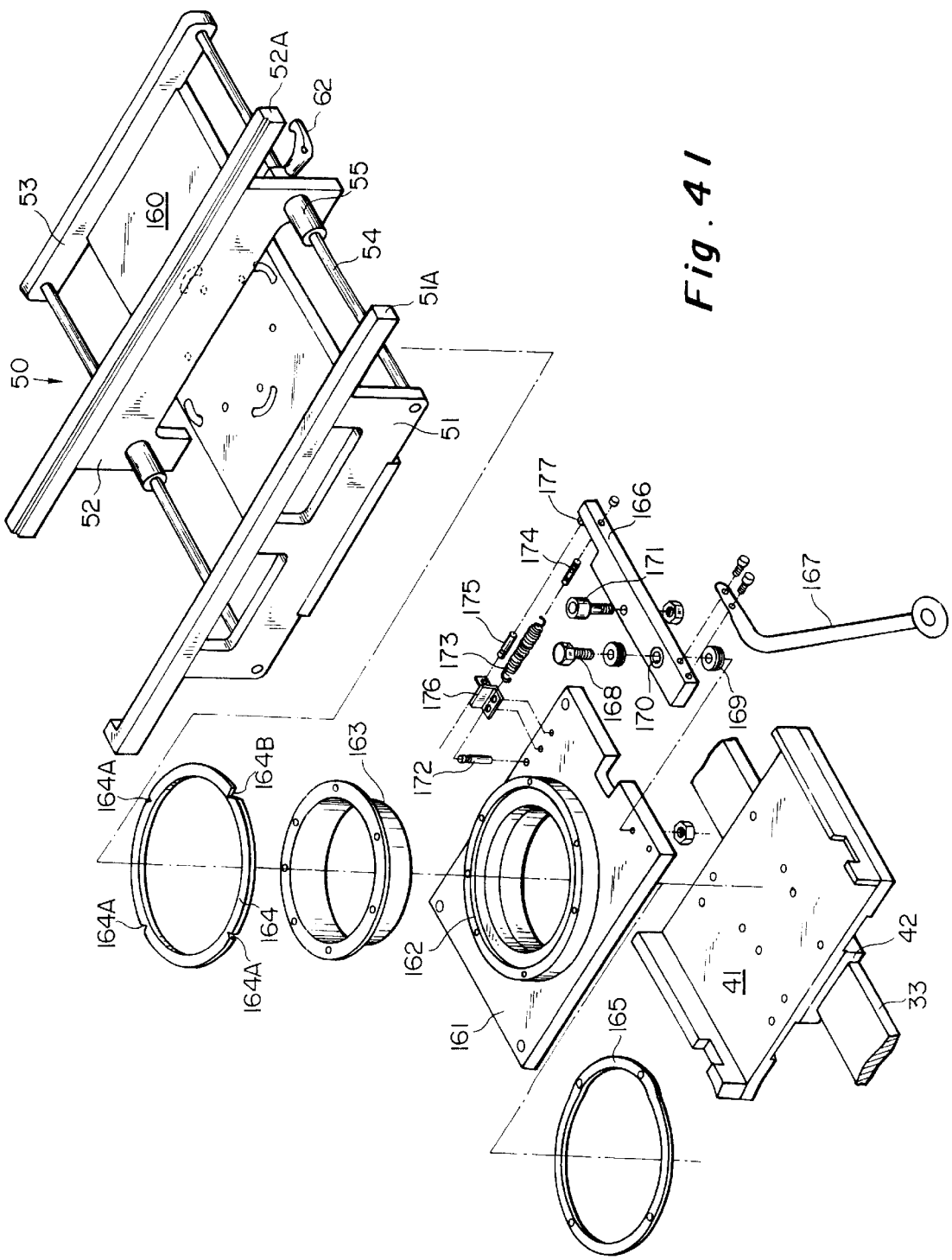
FIG. 41 is an exploded perspective view showing an example of the mechanical construction of the visual inspection supporting apparatus (Part 3)

FIG. 41 illustrates still another example of the construction of the Y-axis table. In the present embodiment, a rotating base 160 is rotatably provided on a Y stage 41. A board supporting body 50 is disposed on the rotating base 160. When a PC board on which a part having leads (electrodes) extending to four perpendicular directions is mounted is set on the board supporting body 50, the board supporting body 50 is rotated in a horizontal plane to rotate the PC board, to facilitate correcting work of an unacceptable soldered portion of the part.

A supporting plate 161 is fixed to the Y stage 41 through an intermediate plate 165. The supporting plate 161 is provided with a cross-roller bearing 162. On the other hand, a positioning ring 164 and a shaft 163 are fixed to the lower surface of the rotating base 160. Four V grooves 164A and 164B are formed at angular intervals of 90° in the positioning ring 164. The V groove indicated by "164B" out of the V grooves is deeper than the other V groove 164A, which represents the position of the origin. The shaft 163 is rotatably received by the bearing 162, whereby the rotating base 160 is rotatably supported on the Y stage 41.

An arm 166 is rotatably pivoted at its one end on the supporting plate 161 through a shaft 168, a thrust bearing 169 and a bush 170. A lever 167 is fixed to the base end of the arm 166. A cam follower 171 is rotatably mounted on an approximately middle point of the arm 166. A spring (a helical tension spring) 173 is provided between a pin 172 standing on the supporting plate 161 and a spring post 174 at the top end of the arm 166. Consequently, the top end of the arm 166 is urged by the spring 173, so that the cam follower 171 is brought into contact with the peripheral surface of the positioning ring 164 or is fitted in the V groove 164A or 164B. The rotating base 160 is positioned in four positions where the cam follower 171 is fitted in the V groove 164A or 164B.

When the rotating base 160 is rotated, the cam follower 171 may be drawn out of the V groove 164A or 164B against the urging force of the spring 173 by means of the lever 167 to rotate the rotating base 160 by hand.

A proximity switch 175 is mounted on the supporting base 161 by a bracket 176. On the other hand, an object 177 to be detected of the proximity switch 175 is mounted on the top end of the arm 166. When the cam follower 171 is fitted in the deepest groove 164B, the object 177 to be detected comes closest to the proximity switch 175. The proximity switch 175 outputs a detection signal only at this time. Consequently, it is recognized that the rotating base 160 is in the position of the origin by the detection signal of the proximity switch 175. The driving of the Y stage 41 may be allowed on the basis of this detection signal.

The board supporting body 50 can also be provided on the rotating base 160 so as to be capable of being raised and lowered as required. In addition, it is also possible to provide a drawable sliding member on the rotating base 160 and provide the board supporting body on the sliding member fixedly or so as to be capable of being raised and lowered.

(9) Still Another Examples of Mechanical Construction

Figure 42A:
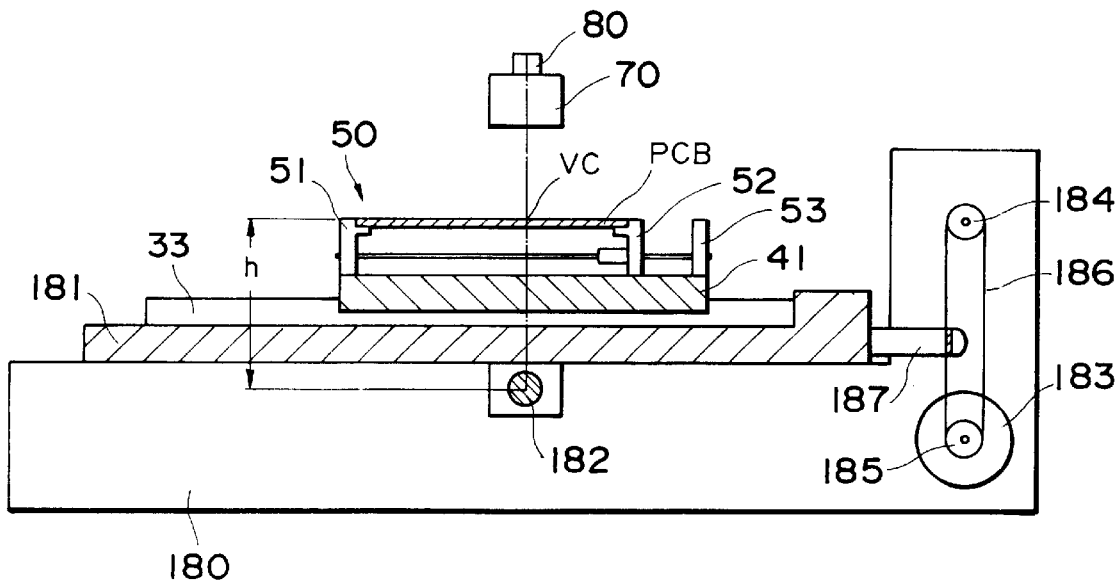
FIGS. 42a and 42b illustrate a structure for inclining a Y table base.

In FIG. 42a, a Y-axis table base 181 is swingably supported on an apparatus base 180 by a pivot shaft 182. The pivot shaft 182 coincides with a moving path of a light projecting device 70 and an imaging device 80. Specifically, the shaft 182 is positioned just below the center VC of the view of field of the imaging device 80. A rail 33 is provided on the base 181, and a Y stage 41 is moved along the rail 33. A board supporting body 50 for supporting a PC board PCB is fixedly provided on the Y stage 41.

A motor 183 for swing is positioned at the rear of the apparatus base 180, and a timing belt 186 is reeved around a pulley 185 fixed to the rotational shaft of the motor 183 and a pulley 184 rotatably provided above the pulley 185. The timing belt 186 is linked to an attaching piece 187 provided for the base 181 at a portion thereof.

Figure 42B:
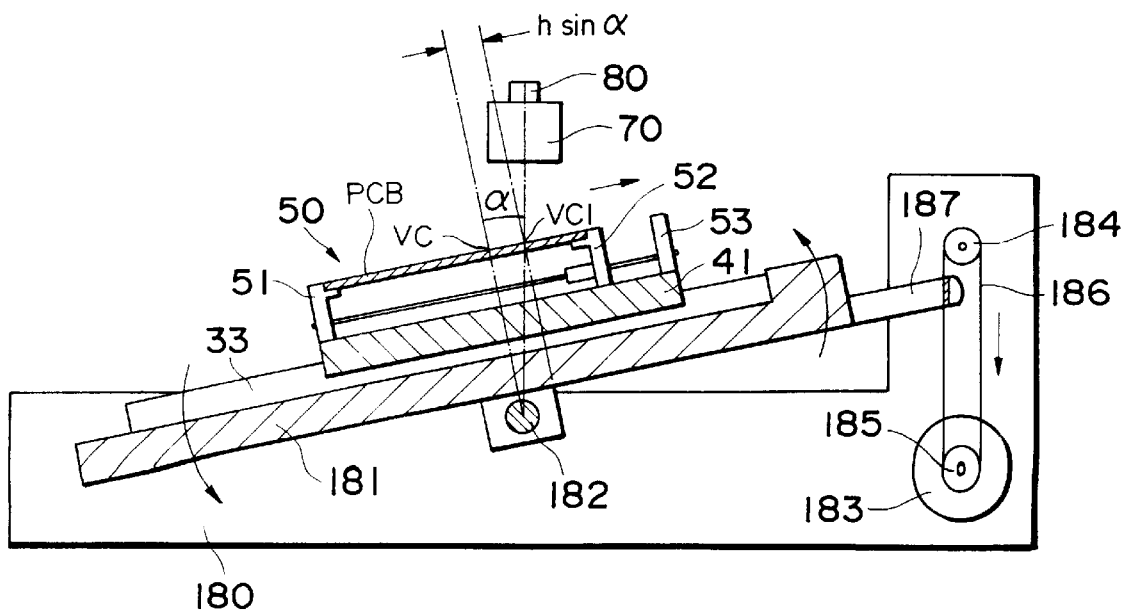

The base 181 is inclined, as shown in FIG. 42b, by rotating the motor 183. It is thus possible to observe an area to be detected on the PC board PCB through the imaging device 80 in a state where the PC board PCB is inclined.

However, the center VC of the visual field moves, as indicated by "VC1", by inclining the base 181. In order to bring the VC to the center of the visual field of the imaging device 80, the Y stage 41 is slightly moved (backward in this example). Letting h and α be the height from the center of the shaft 182 to the PC board PCB and the angle of inclination of the base 181, respectively, the Y stage 41 may be moved by a distance of h·sin α. Since the height h is a fixed value and the angle of inclination α can be calculated from the amount of rotation of the motor 183, the Y stage 41 can be automatically moved.

Figure 43A:
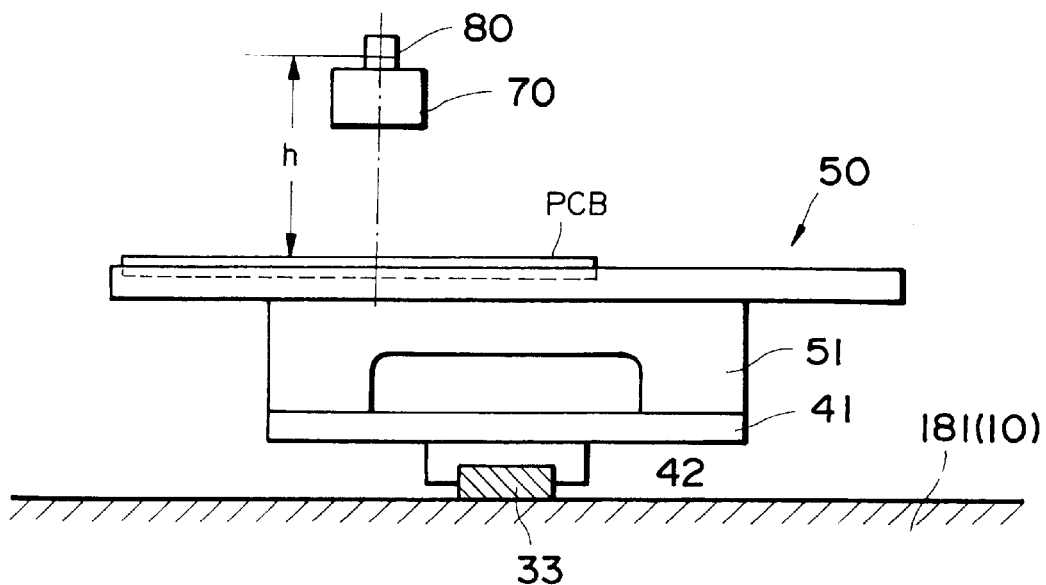
FIGS. 43a to 43b illustrate a structure for inclining a light projecting device and an imaging device.
Figure 43B:
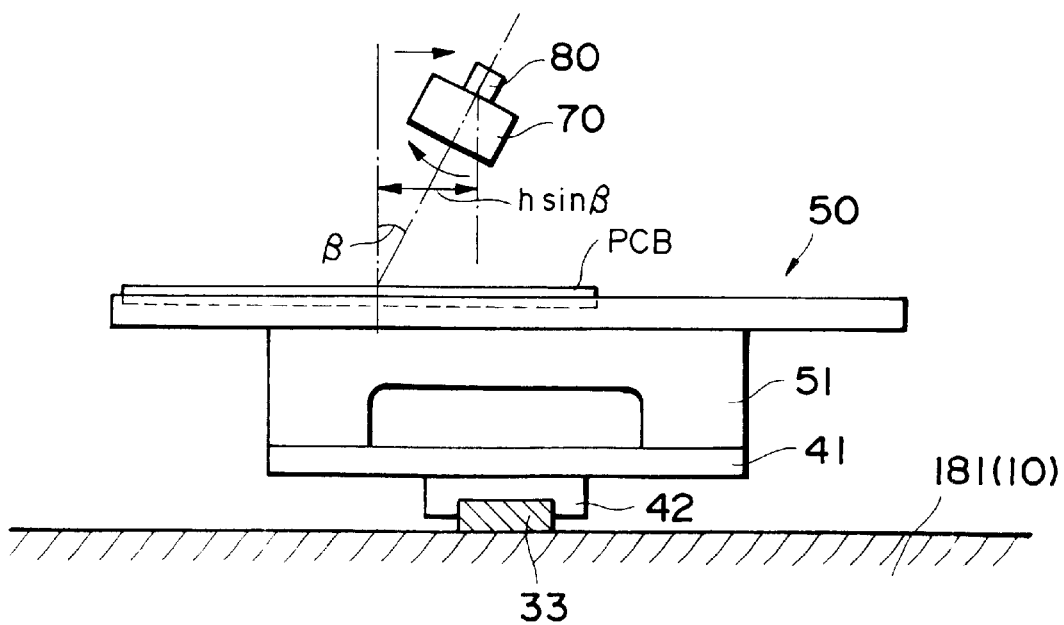

FIGS. 43a and 43b relate to an X-axis table, which is so adapted as to incline the light projecting device 70 and the imaging device 80. The Y stage 41 travels on the swinging base 181 or the fixed base 10.

If it is assumed that the light projecting device 70 and the imaging device 80 are inclined at an angle of β to a perpendicular, the visual field of the imaging device 80 is shifted by a distance of h·sin β, where h is the distance between an image forming surface of the imaging device 80 and the PC board PCB. Therefore, an X stage is moved by the above amount of the shift in order to compensate for the shift of the visual field.

Figure 44:
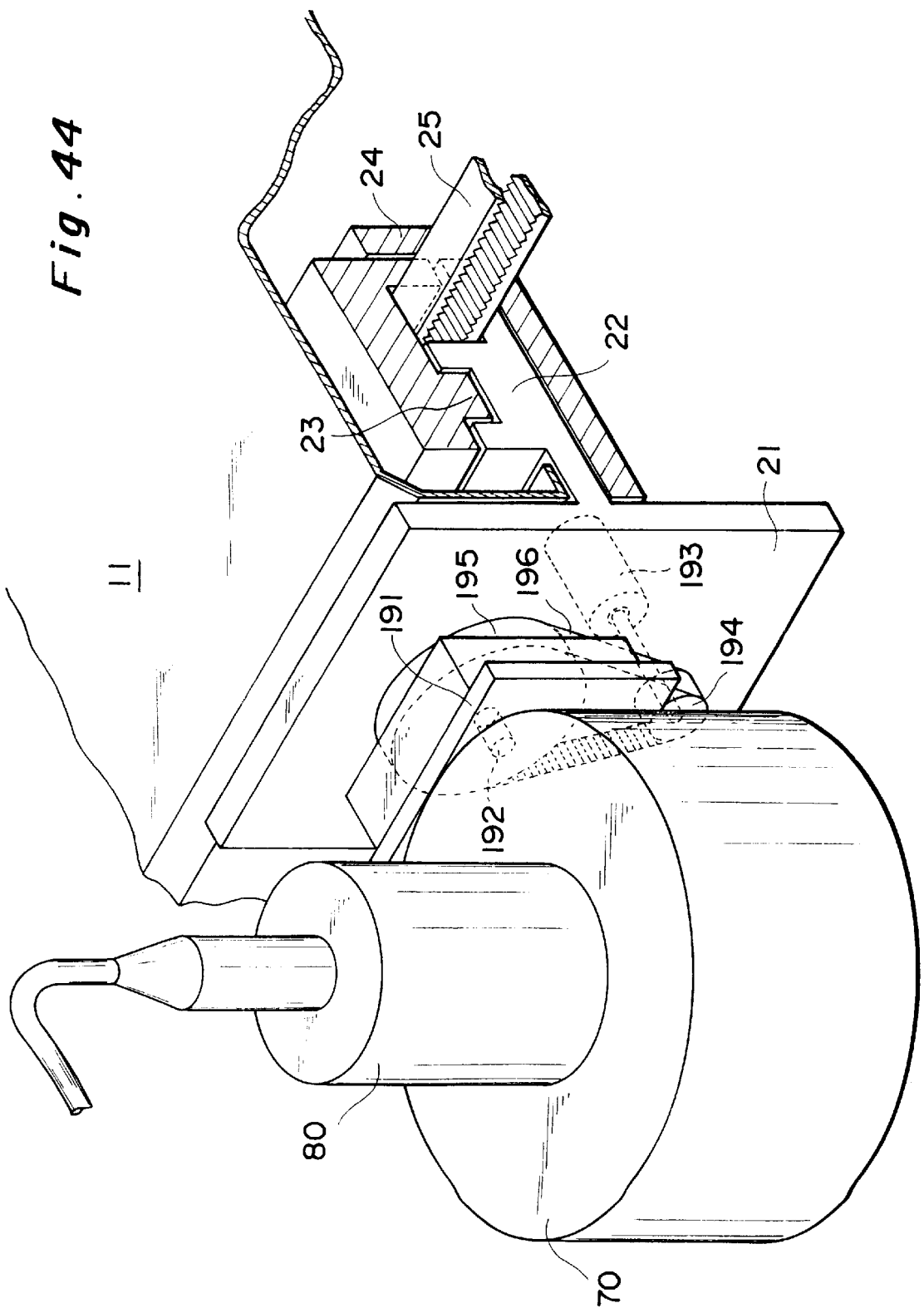
FIG. 44 is an enlarged perspective view of an X stage.

FIG. 44 illustrates a mechanism for inclining the light projecting device 70 and the imaging device 80. The light projecting device 70 and the imaging device 80 are fixed to a mounting plate 191. A shaft 192 is fixed to the mounting plate 191. The shaft 192 is rotatably supported by the X stage 21. A pulley 195 is fixed to the shaft 192. A motor 193 is mounted on the X stage 21, and a pulley 194 is fixed to the rotational shaft of the motor 193. A timing belt 196 is reeved around the pulleys 194 and 195. The light projecting device 70 and the imaging device 80 can be inclined at an arbitrary angle in an arbitrary direction by rotating the motor 193 in the forward and reverse directions. The movement of the X stage 21 depends on the motor 29, as described above.

(10) Still Another Embodiments

Although in the above described teaching processing, the inspector enters a designated point representing a point to be inspected from a keyboard, the designated point can also be determined using position data representing a part to be mounted which is stored in a CAD system for designing a PC board, or position data representing a position where a part is to be mounted or of a soldered portion which are held by a part mounting apparatus for mounting a part on a PC board. In this case, all positions represented by the existing data or its groups may be taken as designated points. Alternatively, the position data, along with an image, may be displayed on a display screen, to make the inspector select any of the position data.

Although in the example of the construction of the above described mechanism, the board supporting body is so constructed that it is pivoted at its front end and is raised by pulling up its rear end, the board supporting body may be pivoted in the middle position between the front end and the rear end thereof. In addition, the board supporting body can also be brought into its raised state (inclined state) by pivoting the board supporting body at its rear end and lowering its front end.

Although in the above described teaching processing, the inspector sets an inspection area, the apparatus may set an inspection area. The number of inspection areas into which a PC board should be divided is calculated based on the size of the PC board and the size of the visual field of the imaging device. If the number of inspection areas is determined, an XY table is so controlled that the visual field is successively set in the respective divided inspection areas. Teaching processing is performed for each visual field (inspection area).

FIG. 45 illustrates an example of the construction of a system utilizing the above described visual inspection supporting apparatus as a soldering correcting apparatus.

An automatic PC board inspecting apparatus 301 judges whether or not soldering on a PC board is acceptable, to produce data representing the result of inspection. The inspection result data includes at least a PC board ID, position data representing an unacceptable portion, a defect code. The inspection result data is sent to a data collecting apparatus 302. The data collecting apparatus 302 stores the inspection result data in a floppy disk FD, and sends the inspection result data to a soldering correcting apparatus 303 online or via a server 304. The inspection result data stored in the floppy disk FD is read by the soldering correcting apparatus 303.

In the soldering correcting apparatus 303, when a defective PC board is set in an XY table and the PC board ID is entered, the XY table is so controlled that an area including an unacceptable soldered portion is imaged on the basis of the pertinent inspection result data. An image picked-up is displayed on a display device. The displayed image is frozen. A correction worker draws out the PC board toward himself or herself and corrects unacceptable soldering on the PC board while seeing the displayed image.

The PC board ID can also be entered by the worker. Alternatively, a bar code expressed on the PC board may be read by a bar code reader connected to the data collecting apparatus 302 and transmitted to the soldering correcting apparatus 303 from the data collecting apparatus 302.

What is claimed is:

1. A visual inspection supporting apparatus, comprising:
   a board supporting member supporting a printed circuit board to be inspected;
   a stage having said board supporting member and being moveable in at least one direction;
   an illuminating device illuminating the printed circuit board to be inspected;
   an imaging device imaging an area on the printed circuit board illuminated by said illuminating device and outputting an image signal representing an image obtained by the imaging;
   a display device displaying the image represented by the image signal outputted from said imaging device;
   a command input device entering a movement command and a return command;
   a stage drive device moving said stage to a predetermined position in response to the movement command entered through said command input device; and
   a device storing the current position of said stage when the movement command is issued and controlling said stage drive device to return said stage to the current position when the return command is issued.

2. The visual inspection supporting apparatus according to claim 1, wherein said board supporting member is supported on said stage configured to be raised and laid down.

3. The visual inspection supporting apparatus according to claim 2, further comprising:
   a sensor detecting that said board supporting member is in a horizontal position on said stage,
   said stage being controlled so as to be returned to the current position in response to the return command, when a detecting signal is outputted from said sensor.

4. A visual inspection supporting apparatus, comprising:
   a stage supporting a printed circuit board to be inspected and is movable;
   an illuminating device illuminating said board;
   an imaging device imaging an area on the board illuminated by said illuminating device and outputting an image signal representing an image obtained by the imaging;
   a display device displaying the image represented by the image signal outputted from said imaging device;
   a storage device storing a previously taught position representing a point to be inspected on the board; and
   a display control device performing control so as to indicate the point to be inspected on the image displayed on said display device in accordance with the position data stored in said storage device,
   said display control device changing, when there are a plurality of points to be inspected on the displayed image, said indication of the point for each entry indicating that inspection has been completed in accordance with a predetermined order.

5. A visual inspection supporting apparatus, comprising:
   a stage supporting a printed circuit board to be inspected and is movable;

an illuminating device illuminating said board;

an imaging device imaging an area on the board illuminated by said illuminating device and outputting an image signal representing an image obtained by the imaging;

a display device displaying the image represented by the image signal outputted from said imaging device;

a storage device storing a previously taught position data representing a point to be inspected on the board; and a display control device performing control so as to indicate the point to be inspected on the image displayed on said display device in accordance with the position data stored in said storage device, said display control device changing, when there are a plurality of points to be inspected on the displayed image, said indication of the point for each predetermined time in accordance with a predetermined order.

6. A visual inspection supporting apparatus, comprising:

an illuminating device illuminating a printed circuit board to be inspected;

an imaging device imaging an area on the printed circuit board illuminated by said illuminating device and outputting an image signal representing an image obtained by the imaging;

a display device displaying the image represented by the image signal outputted from said imaging device;

a board supporting member supporting the board to be inspected;

a stage which is movable and has the board supporting member; and a mechanism moving said stage until the board supported on said board supporting member reaches a position outside of a range in which said illuminating device and said imaging device exist;

a storage device storing a previously taught position data representing a point to be inspected on the board to be inspected; and a display control device performing control to indicate the point to be inspected on the image displayed on said display device in accordance with the position data stored in said storage device, said illuminating device and said imaging device being fixed to each other and being movably arranged in one of two perpendicular directions, and said stage being arranged movably in the other of said two perpendicular directions, and said display control device performing control to provide a layout display indicating the position on the board of said indicated point.

7. A printed circuit board inspecting apparatus, comprising:

an illuminating device illuminating a printed circuit board to be inspected;

an imaging device imaging an area on the board illuminated by said illuminating device and outputting an image signal representing an image obtained by the imaging;

a stage which is moveable relative to said illuminating device and said imaging device in two perpendicular directions;

a board supporting member supported on said stage supporting the board to be inspected;

a display device displaying the image represented by the image signal outputted from said imaging device;

a base pivotally supporting said stage; and a device moving said stage so that the center of a visual field of said imaging device does not move on the board based on the angle of inclination when said base is inclined.

8. A printed circuit board inspecting apparatus, comprising:

an illuminating device illuminating a printed circuit board to be inspected;

an imaging device imaging an area on the board illuminated by said illuminating device and outputting an image signal representing an image obtained by the imaging;

a first stage which is movable relative to said illuminating device and said imaging device in two perpendicular directions;

a board supporting member supported on said first stage supporting the board to be inspected;

a display device displaying the image represented by the image signal outputted from said imaging device;

a second stage pivotally supporting said illuminating device and said imaging device; and a device moving said second stage so that the center of a visual field of said imaging device does not move on the board based on the angle of inclination when said illuminating device and said imaging device are inclined.

9. A board inspecting apparatus, comprising:

an illuminating device illuminating a printed circuit board to be inspected;

an imaging device imaging an area on the printed circuit board illuminated by said illuminating device and outputting an image signal representing an image obtained by the imaging;

a stage which is movable relative to said illuminating device and said imaging device in two perpendicular directions;

a board supporting member supported on said stage supporting the board to be inspected;

a storage device storing data representing inspection areas, displayed on one display screen, of the board to be inspected and storing previously taught position data representing the position of a portion to be inspected for each inspection area;

a display device displaying an enlarged image of an inspection area designated on the basis of the image signal outputted from said imaging device; and a display control device performing control so as to indicate the position of the portion to be inspected on the enlarged image displayed on said display device in accordance with the data representing the inspection areas and the position data which are stored in said storage device; wherein said display control device changes, when there are the positions of a plurality of portions to be inspected on the displayed image, said indication of the position of the portion to be inspected for each entry indicating that inspection has been completed for each predetermined time in accordance with a predetermined order.

10. A board inspecting apparatus, comprising:

an illuminating device illuminating a printed circuit board to be inspected;

an imaging device imaging an area on the printed circuit board illuminated by said illuminating device and outputting an image signal representing an image obtained by the imaging;

a stage which is movable relative to said illuminating device and said imaging device in two perpendicular directions;

a board supporting member supported on said stage supporting the board to be inspected;

a storage device storing data representing inspection areas, displayed on one display screen, of the board to be inspected and storing previously taught position data representing the position of a portion to be inspected for each inspection area;

a display device displaying an enlarged image of an inspection area designated on the basis of the image signal outputted from said imaging device; and a display control device performing control so as to indicate the position of the portion to be inspected on the enlarged image displayed on said display device in accordance with the data representing the inspection areas and the position data which are stored in said storage device; and an input device entering the result of the inspection of the position of the portion to be inspected performed in relation to the indication of the position of the portion to be inspected on said display device.

11. The board inspecting apparatus according to claim 10, wherein said display control device indicates the position of the portion to be inspected which is entered by said input device as unacceptable.

12. A board inspecting apparatus, comprising:

an illuminating device illuminating a printed circuit board to be inspected;

an imaging device imaging an area on the printed circuit board illuminated by said illuminating device and outputting an image signal representing an image obtained by the imaging;

a stage which is movable relative to said illuminating device and said imaging device in two perpendicular directions;

a board supporting member supported on said stage supporting the board to be inspected;

a storage device storing data representing inspection areas, displayed on one display screen, of the board to be inspected and storing previously taught position data representing the position of a portion to be inspected for each inspection area;

a display device displaying an enlarged image of an inspection area designated on the basis of the image signal outputted from said imaging device; and a display control device performing control so as to indicate the position of the portion to be inspected on the enlarged image displayed on said display device in accordance with the data representing the inspection areas and the position data which are stored in said storage device; wherein said display control device further controls said display device so as to provide a layout display indicating the position on the board of an area of the image displayed on said display device and indicate the position on the board of said indicated position of the portion to be inspected in the layout display.

13. A board inspecting apparatus, comprising:

an illuminating device illuminating a printed circuit board to be inspected;

an imaging device imaging inspection areas on the printed circuit board and outputting an image signal representing an image obtained by the imaging;

a stage which is movable relative to said illuminating device and said imaging device in two perpendicular directions;

a board supporting member supported on said stage supporting the board to be inspected;

a display device displaying the image in the inspection area represented by the image signal outputted from said imaging device;

a storage device storing position data representing each of the inspection areas on the board; and a display control device for performing control so as to provide on said display device a layout display indicating the position on the board of the inspection area in the image displayed on said display device on the basis of said position data in addition to the display of the image in the inspection area.

14. The board inspecting apparatus according to claim 13, wherein said display control device performs control so as to indicate an area of the image where inspection has been completed.

15. A board inspecting apparatus, comprising:

an illuminating device illuminating a printed circuit board to be inspected;

an imaging device imaging an area on the printed circuit board illuminated by said illuminating device and outputting an image signal representing an image obtained by the imaging;

a stage which is movable relative to said illuminating device and said imaging device in two perpendicular directions;

a board supporting member supported on said stage supporting the board to be inspected;

a display device displaying the image represented by the image signal outputted from said imaging device;

a display control device displaying a window on a display screen of said display device; and a control device converting the size of a predetermined particular image in said window into numerical information and displaying the numerical information on said display device.

16. The board inspecting apparatus according to claim 15, further comprising an input device designating the position and the size of said window.

17. The board inspecting apparatus according to claim 15, wherein said control device displays data relating to the reference size in addition to the data relating to the size of said particular image.

* * * * *